United States Patent
Seo et al.

(10) Patent No.: US 10,923,402 B2
(45) Date of Patent: Feb. 16, 2021

(54) SEMICONDUCTOR DEVICE AND METHOD OF MANUFACTURING THE SAME

(71) Applicant: SAMSUNG ELECTRONICS CO., LTD., Suwon-si (KR)

(72) Inventors: Eun-Chul Seo, Hwaseong-si (KR); Kyoungpil Park, Yongin-si (KR); Doo-Hwan Park, Yongin-si (KR); Seongho Park, Suwon-si (KR); Aee Young Park, Yongin-si (KR); Kyungmin Chung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/358,810

(22) Filed: Mar. 20, 2019

(65) Prior Publication Data
US 2019/0318968 A1    Oct. 17, 2019

(30) Foreign Application Priority Data
Apr. 17, 2018    (KR) ........................ 10-2018-0044418

(51) Int. Cl.
| | |
|---|---|
| H01L 21/8238 | (2006.01) |
| H01L 21/311 | (2006.01) |
| H01L 21/308 | (2006.01) |
| H01L 27/092 | (2006.01) |
| H01L 21/768 | (2006.01) |
| H01L 21/56 | (2006.01) |
| H01L 21/033 | (2006.01) |

(52) U.S. Cl.
CPC .. *H01L 21/823864* (2013.01); *H01L 21/0337* (2013.01); *H01L 21/3086* (2013.01); *H01L 21/31144* (2013.01); *H01L 21/565* (2013.01); *H01L 21/7684* (2013.01); *H01L 21/76816* (2013.01); *H01L 21/823821* (2013.01); *H01L 27/0924* (2013.01)

(58) Field of Classification Search
None
See application file for complete search history.

(56) References Cited

U.S. PATENT DOCUMENTS

| | | | |
|---|---|---|---|
| 7,732,341 B2 | 6/2010 | Koh et al. | |
| 8,637,982 B2 | 1/2014 | Ogisu et al. | |
| 8,835,323 B1 | 9/2014 | Shieh et al. | |
| 9,581,900 B2 | 2/2017 | Shieh et al. | |
| 9,634,012 B2 | 4/2017 | Park et al. | |
| 9,773,676 B2 | 9/2017 | Chang et al. | |

(Continued)

*Primary Examiner* — Long Pham
(74) *Attorney, Agent, or Firm* — Sughrue Mion, PLLC

(57) ABSTRACT

A method of manufacturing a semiconductor device may include forming a hardmask layer on a substrate, forming a first mold pattern on the hardmask layer using a first photolithography process, conformally forming a spacer layer on the first mold pattern and on portions of the hardmask layer exposed by the first mold pattern, forming a first mold layer using a second photolithography process. The first mold layer may have a first opening that exposes a portion of the spacer layer. The method may include forming a spacer pattern by anisotropically etching the portion of the spacer layer exposed by the first opening until a portion of a top surface of the hardmask layer is exposed, and using the spacer pattern as an etching mask to pattern the hardmask layer.

15 Claims, 33 Drawing Sheets

(56) References Cited

U.S. PATENT DOCUMENTS

| | | | |
|---|---|---|---|
| 9,852,986 B1 | 12/2017 | Stephens et al. | |
| 2009/0093121 A1* | 4/2009 | Moon | H01L 21/0337 438/696 |
| 2012/0118854 A1* | 5/2012 | Smayling | H01L 21/823456 216/37 |
| 2013/0196477 A1* | 8/2013 | Kang | H01L 21/28017 438/270 |
| 2017/0221702 A1 | 8/2017 | Lee et al. | |
| 2017/0294311 A1* | 10/2017 | Huang | H01L 21/461 |
| 2019/0318968 A1* | 10/2019 | Seo | H01L 27/0924 |

* cited by examiner

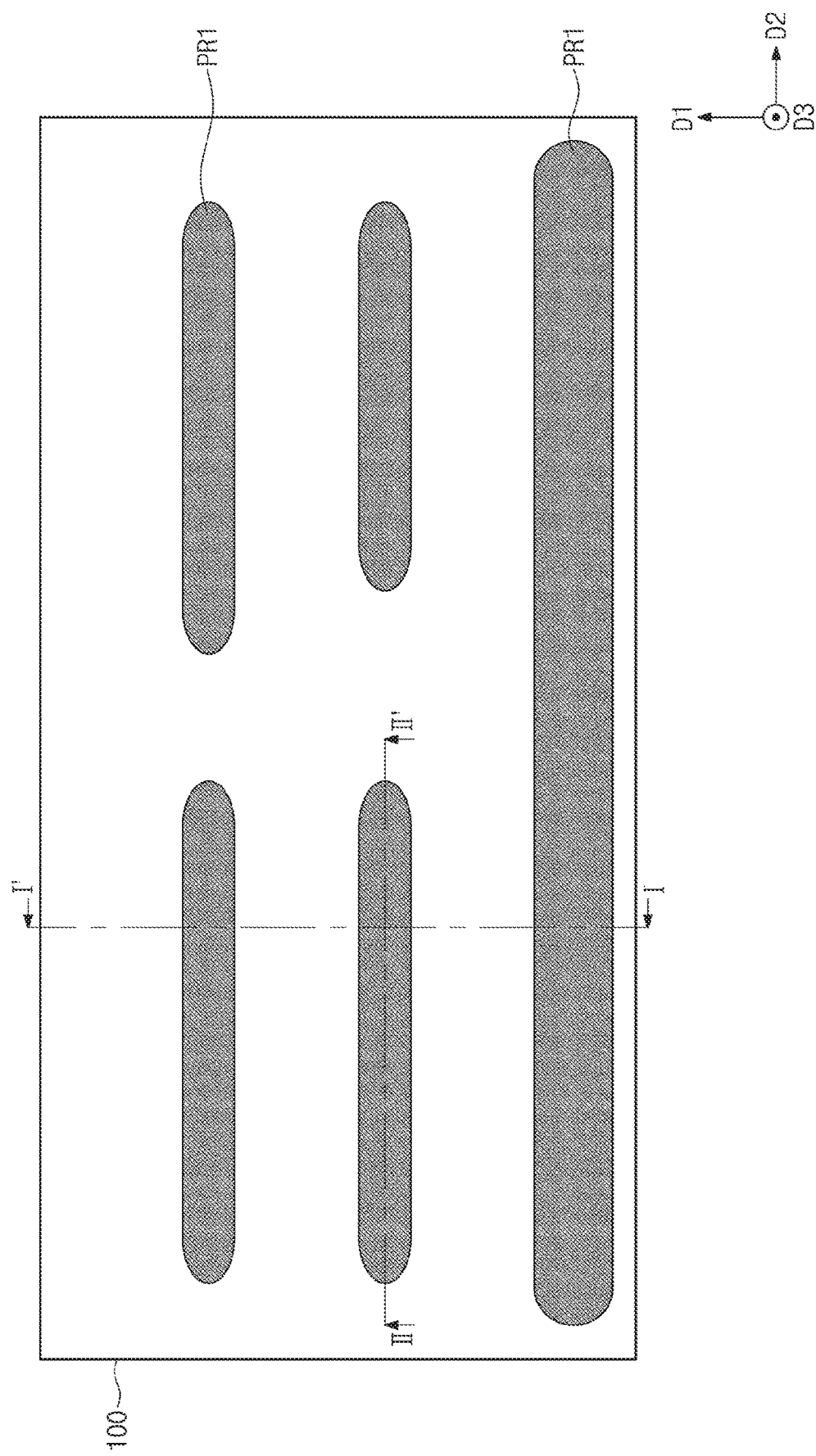

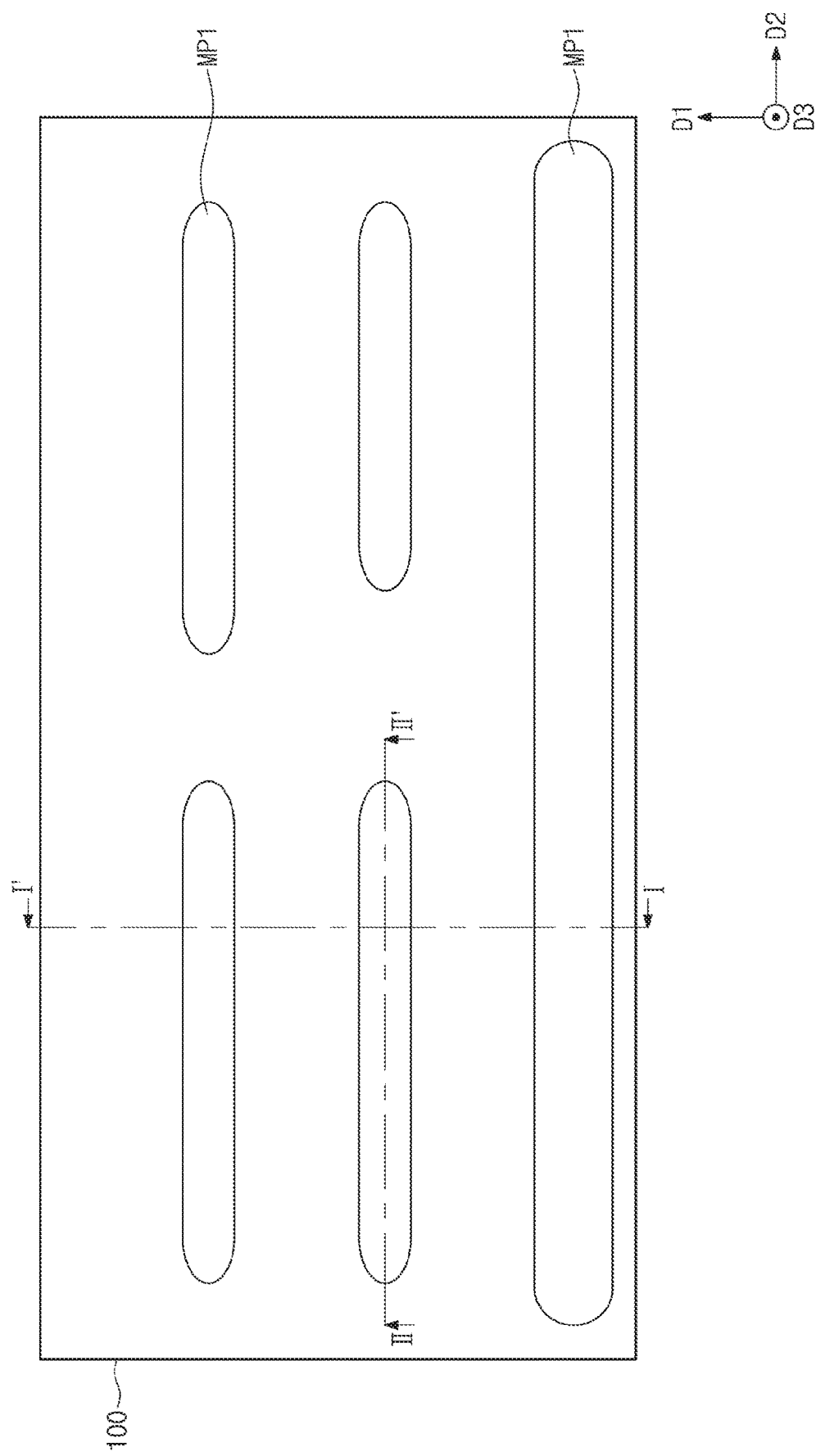

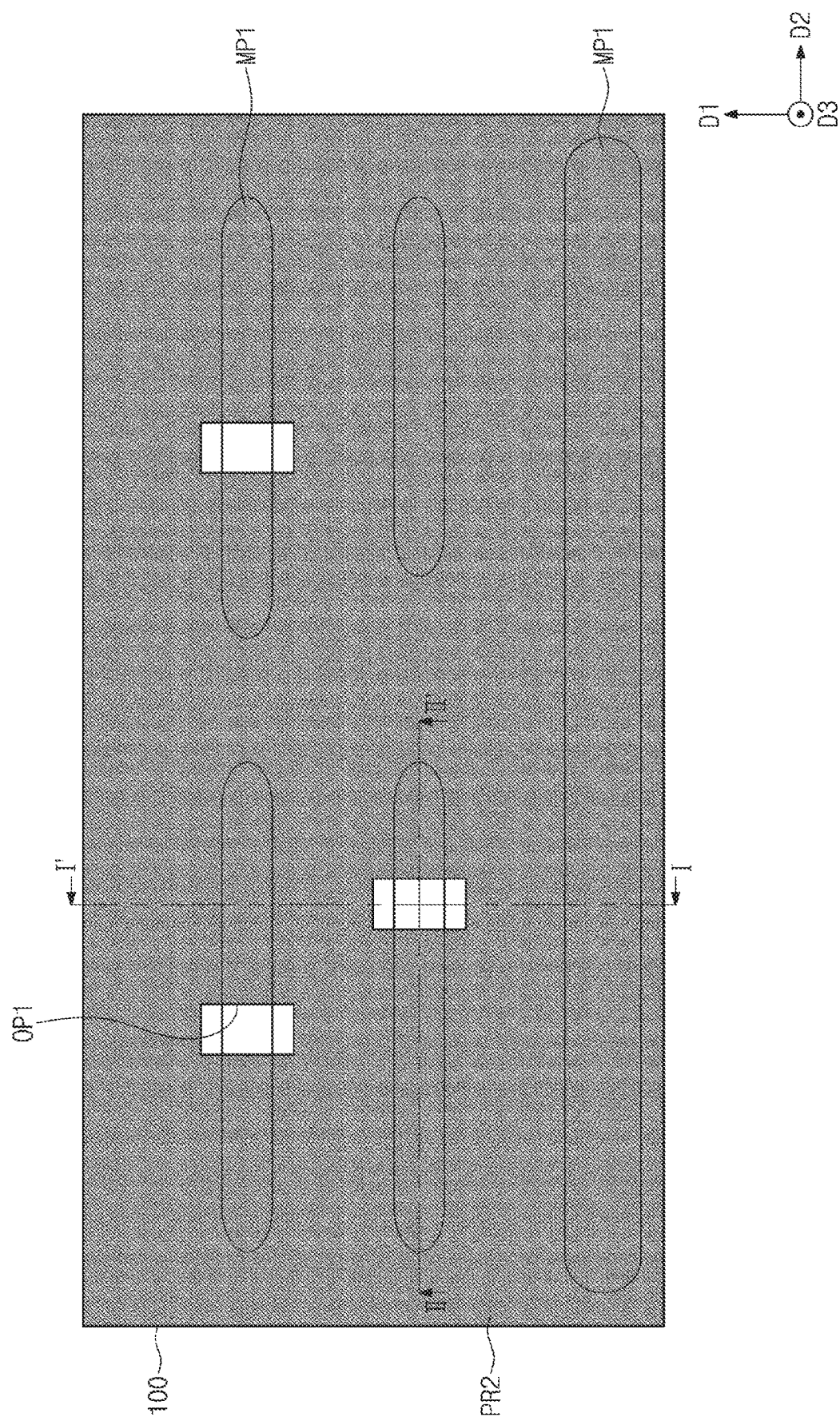

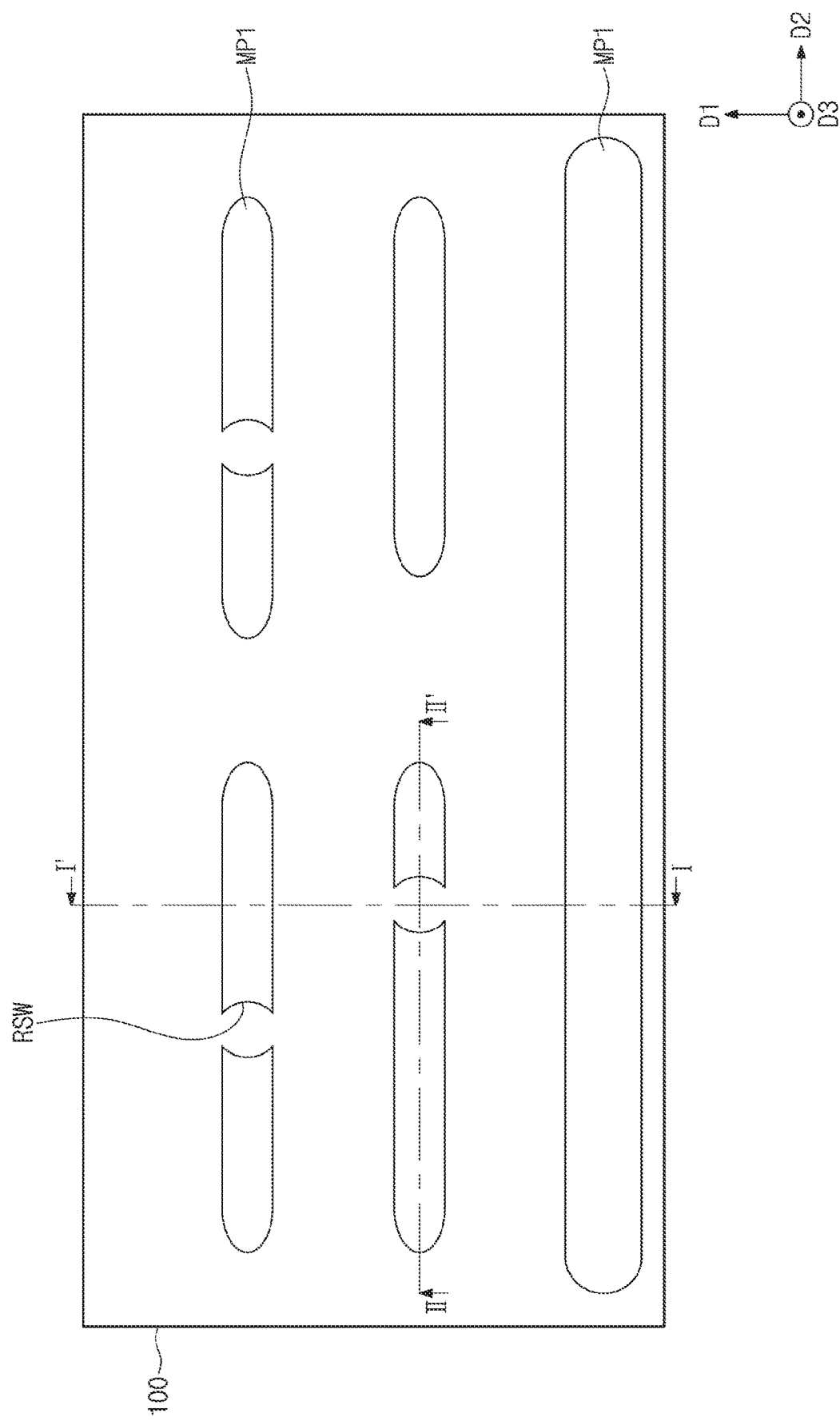

US 10,923,402 B2

SEMICONDUCTOR DEVICE AND METHOD OF MANUFACTURING THE SAME

CROSS-REFERENCE TO RELATED APPLICATION

This U.S. nonprovisional application claims priority under 35 U.S.C. § 119 to Korean Patent Application No. 10-2018-0044418 filed on Apr. 17, 2018 in the Korean Intellectual Property Office, the entire contents of which are hereby incorporated herein by reference in their entirety.

FIELD

Embodiments of the inventive concepts relate to semiconductor devices and methods of manufacturing the same, and more particularly, to semiconductor devices including metal patterns on an integrated circuit of a substrate and methods of manufacturing the same.

BACKGROUND

Semiconductor devices may be widely used in the electronic industry because of their small size, multi-functionality, and/or low fabrication cost. Some examples of semiconductor devices may include memory devices for storing data, logic devices for processing data, and hybrid devices for operating various functions contemporaneously or simultaneously.

Semiconductor devices have been increasingly used for high integration with the advanced development of the electronic industry. It therefore may be increasingly difficult to manufacture semiconductor devices because of a process margin reduction in an exposure process defining fine patterns. Semiconductor devices also have been increasingly requested for high speed with the advanced development of the electronic industry.

SUMMARY

Some embodiments of the inventive concepts may provide methods of manufacturing semiconductor devices, the methods capable of forming highly-integrated fine metal patterns without process defects, and may provide semiconductor devices manufactured by the same.

According to some embodiments of the inventive concepts, a method of manufacturing a semiconductor device may include forming a hardmask layer on a substrate, forming a first mold pattern on the hardmask layer using a first photolithography process, conformally forming a spacer layer on the first mold pattern and on portions of the hardmask layer exposed by the first mold pattern, forming a first mold layer using a second photolithography process. The first mold layer may have a first opening that exposes a portion of the spacer layer. The method may include forming a spacer pattern by anisotropically etching the portion of the spacer layer exposed by the first opening until a portion of a top surface of the hardmask layer is exposed, and using the spacer pattern as an etching mask to pattern the hardmask layer.

According to some embodiments of the inventive concepts, a method of manufacturing a semiconductor device may include forming a first mold pattern on a hardmask layer on a substrate, forming a spacer layer on the first mold pattern and on the hardmask layer. The spacer layer may include a first segment covering a sidewall of the first mold pattern and a second segment horizontally extending from the first segment. The second segment may cover a top surface of the hardmask layer. The method may include forming a first mold layer that exposes a portion of the spacer layer, forming a first opening in the spacer layer by removing the second segment of the exposed portion of the spacer layer via an anisotropic etching process that uses the first segment of the exposed portion as an etching mask, and forming a second opening in the spacer layer by removing the first mold pattern.

According to some embodiments of the inventive concepts, a semiconductor device may include a first conductive pattern and a second conductive pattern that extend in parallel in a first direction on a substrate. The first conductive pattern may be spaced apart from the second conductive pattern at a first distance in a second direction intersecting the first direction. The first conductive pattern may include a first segment adjacent to an end of the first conductive pattern. The first segment may have a width in the second direction that decreases toward the end of the first conductive pattern. The second conductive pattern may include a second segment adjacent to an end of the second conductive pattern that is adjacent to the first segment. The second segment may have a width in the second direction that increases toward the end of the second conductive pattern. A second distance in the second direction between the first segment and the second segment may be substantially equal to the first distance.

BRIEF DESCRIPTION OF THE DRAWINGS

FIGS. 2, 4, 6, 8, 10, 12, 14, 16, 18, and 20 are plan views illustrating operations of methods of manufacturing semiconductor devices, according to some embodiments of the inventive concepts.

DETAILED DESCRIPTION OF EMBODIMENTS

Figure 1:
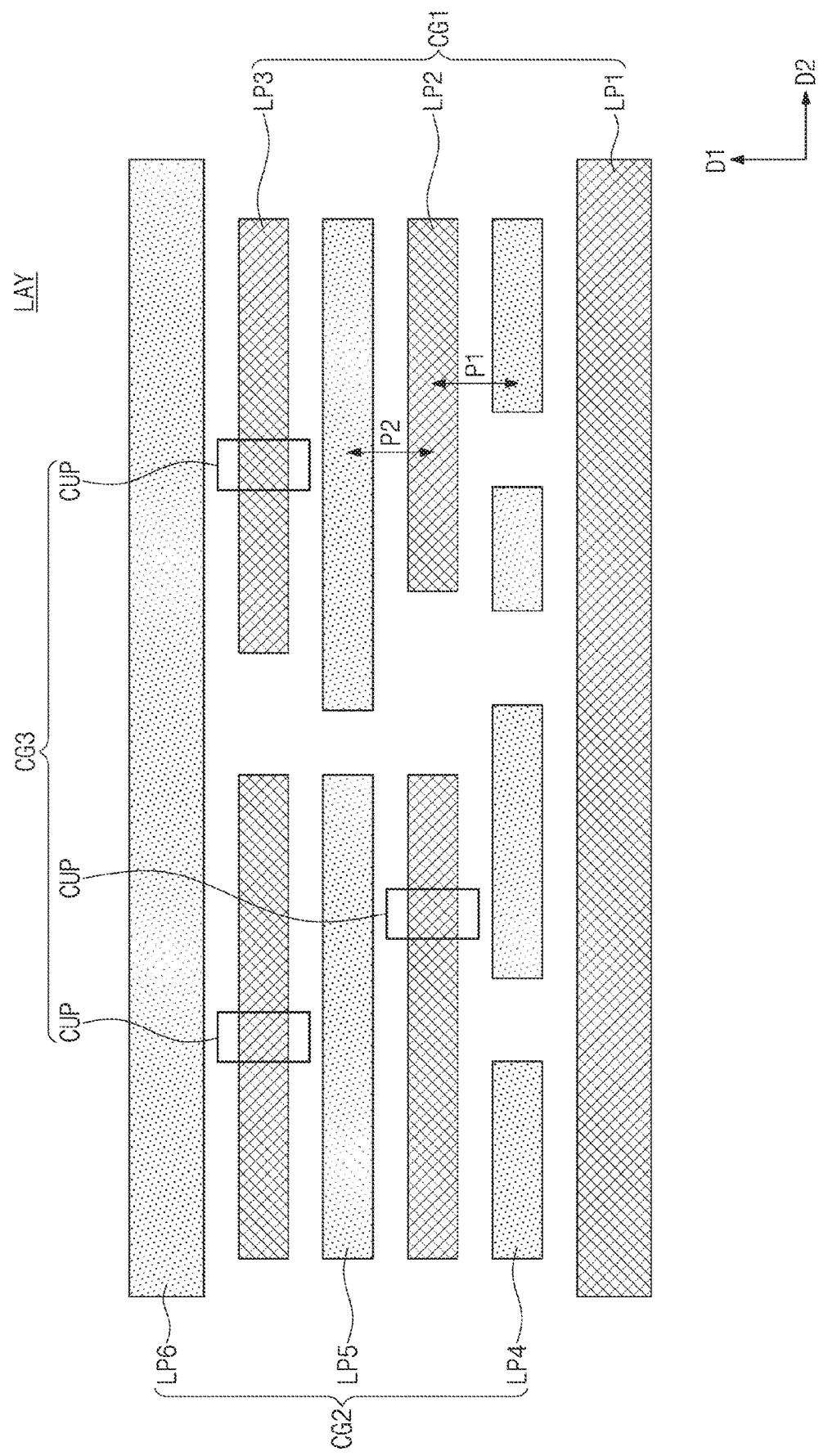
FIG. 1 is a plan view illustrating a layout defining a first metal layer of a semiconductor device, according to some embodiments of the inventive concepts.

FIG. 1 is a plan view illustrating a layout defining a first metal layer of a semiconductor device, according to some embodiments of the inventive concepts.

Referring to FIG. 1, a layout LAY defining a first metal layer may include first to sixth layout patterns LP1 to LP6. The first to sixth layout patterns LP1 to LP6 may define conductive patterns of the first metal layer on a substrate.

Each of the first to sixth layout patterns LP1 to LP6 may have a linear shape extending in a second direction D2. The first to sixth layout patterns LP1 to LP6 may be arranged along a first direction D1. The fourth layout pattern LP4 may be between the first and second layout patterns LP1 and LP2 adjacent to each other in the first direction D1. The fifth layout pattern LP5 may be between the second and third layout patterns LP2 and LP3 adjacent to each other in the first direction D1. The third layout pattern LP3 may be between the fifth and sixth layout patterns LP5 and LP6 adjacent to each other in the first direction D1.

The second to fifth layout patterns LP2 to LP5 may be between the first and sixth layout patterns LP1 and LP6. The first and sixth layout patterns LP1 and LP6 may have substantially the same width. The second to fifth layout patterns LP2 to LP5 may have substantially the same width. The width of each of the first and sixth layout patterns LP1 and LP6 may be greater than the width of each of the second to fifth layout patterns LP2 to LP5.

The second to fifth layout patterns LP2 to LP5 may be arranged at a regular pitch in the first direction D1. For example, a first pitch P1 may be provided between the second and fourth layout patterns LP2 and LP4 adjacent to each other in the first direction D1. A second pitch P2 may be provided between the second and fifth layout patterns LP2 and LP5 adjacent to each other in the first direction D1. The first pitch P1 may be substantially equal to the second pitch P2. As used herein, the term "pitch" may refer to a distance between a center of a first pattern and a center of a second pattern adjacent to the first pattern.

Cut patterns CUP may be provided on the second and third layout patterns LP2 and LP3. Each of the cut patterns CUP may define a region which is not filled with a conductive material when conductive patterns are formed on the substrate. For example, each of the cut patterns CUP may define a region from which a conductive pattern is removed. In some embodiments, the cut patterns CUP may have substantially the same width in the second direction D2.

The first to third layout patterns LP1 to LP3 may constitute a first group CG1, and the fourth to sixth layout patterns LP4 to LP6 may constitute a second group CG2. The cut patterns CUP may constitute a third group CG3.

In a display of the layout LAY, the first to third groups GG1 to CG3 may be displayed to have different colors from each other. For example, the first to third layout patterns LP1 to LP3 of the first group CG1 may be displayed to have a first color, the fourth to sixth layout patterns LP4 to LP6 of the second group CG2 may be displayed to have a second color, and the cut patterns CUP of the third group CG3 may be displayed to have a third color. The first to third colors may be different from each other.

A first photomask may be fabricated based on the first to third layout patterns LP1 to LP3 of the first group CG1. A second photomask may be fabricated based on the fourth to sixth layout patterns LP4 to LP6 of the second group CG2. A third photomask may be fabricated based on the cut patterns CUP of the third group CG3. For example, the layout LAY shown in FIG. 1 may be used to separately fabricate three photomasks. The first to third photomasks may be used to form respective patterns on the substrate.

The higher integration of semiconductor devices may narrow the interval between conductive patterns on a substrate. When a single photomask is used to form a plurality of conductive patterns, such proximity may cause the substrate to have thereon distorted patterns whose shapes are different from that of the layout LAY. When a plurality of photomasks are used to form conductive patterns as discussed in some embodiments of the inventive concepts, an increased interval may be provided between image patterns on a single photomask. As a result, it may be possible to prevent the formation of distorted patterns on the substrate.

FIGS. 2, 4, 6, 8, 10, 12, 14, 16, 18, and 20 are plan views illustrating operations of methods of manufacturing semiconductor devices, according to some embodiments of the inventive concepts. FIGS. 3A, 5A, 7A, 9A, 11A, 13A, 15A, 17A, 19A, and 21A are cross-sectional views taken along line I-I' of FIGS. 2, 4, 6, 8, 10, 12, 14, 16, 18, and 20, respectively. FIGS. 3B, 5B, 7B, 9B, 11B, 13B, 15B, 17B, 19B, and 21B are cross-sectional views taken along line II-II' of FIGS. 2, 4, 6, 8, 10, 12, 14, 16, 18, and 20, respectively.

Figure 3A:
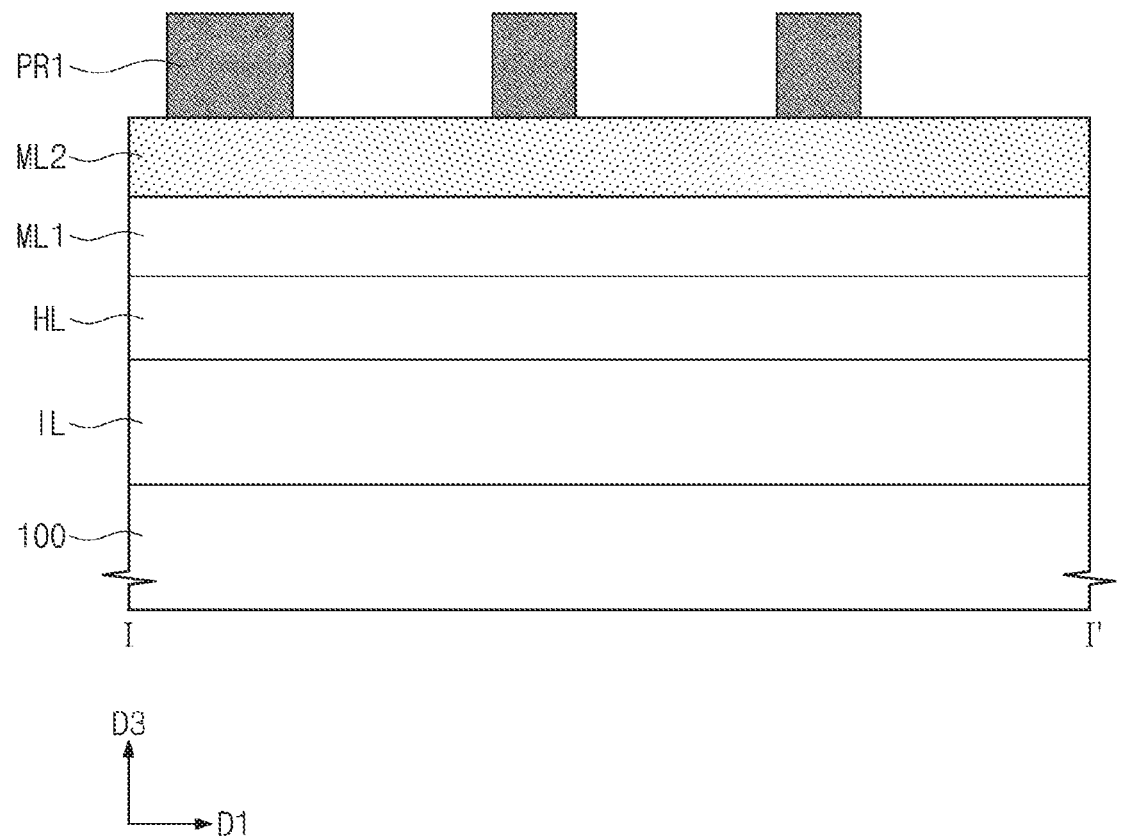
FIGS. 3A, 5A, 7A, 9A, 11A, 13A, 15A, 17A, 19A, and 21A are cross-sectional views taken along line I-I' of FIGS. 2, 4, 6, 8, 10, 12, 14, 16, 18, and 20, respectively.
Figure 3B:
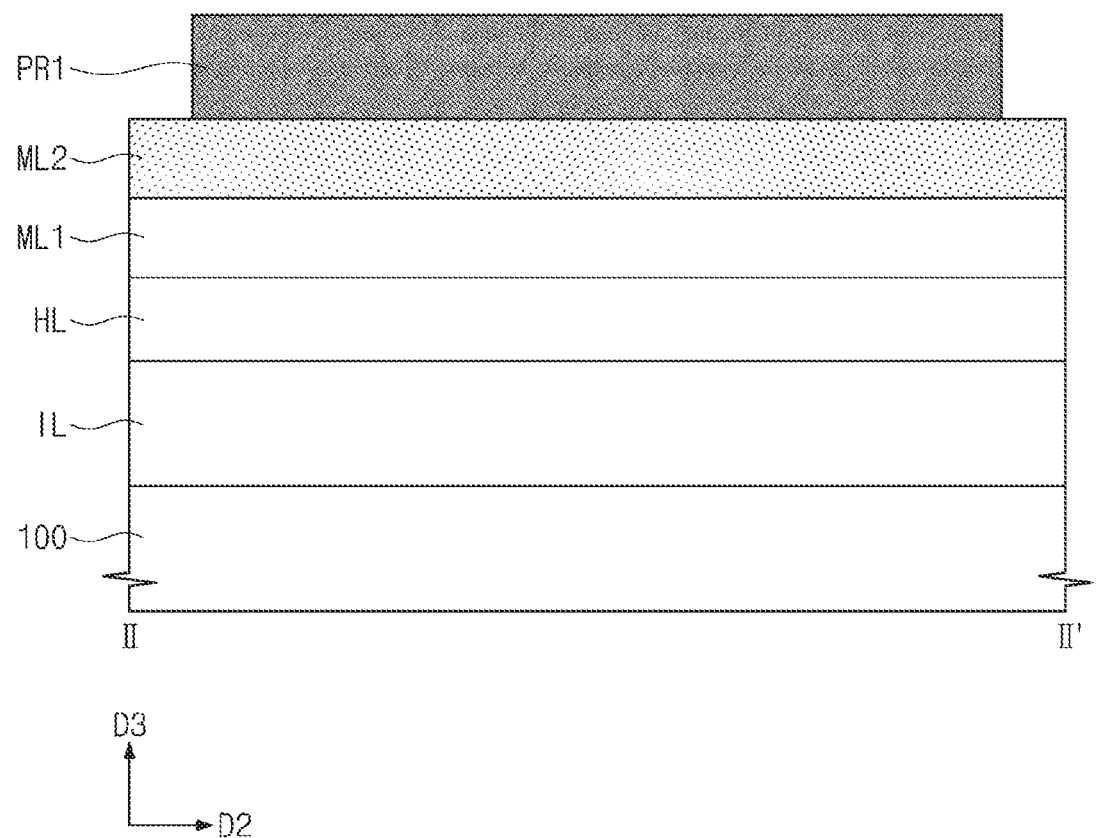
FIGS. 3B, 5B, 7B, 9B, 11B, 13B, 15B, 17B, 19B, and 21B are cross-sectional views taken along line II-II' of FIGS. 2, 4, 6, 8, 10, 12, 14, 16, 18, and 20, respectively.

Referring to FIGS. 2, 3A, and 3B, an interlayer dielectric layer IL, a hardmask layer HL, a first mold layer ML1, and a second mold layer ML2 may be sequentially formed on a substrate 100. The substrate 100 may be or include a silicon substrate, a germanium substrate, or a silicon-germanium substrate. In some embodiments, the substrate 100 may be provided thereon with a plurality of transistors constituting an integrated circuit. The interlayer dielectric layer IL may cover the plurality of transistors.

The hardmask layer HL may exhibit an etch selectivity to the first mold layer ML1 and the interlayer dielectric layer IL. The hardmask layer HL may include an organic layer, an inorganic layer, or a multiple layer in which organic and inorganic layers are stacked. For example, the hardmask layer HL may include one or more of a silicon oxide layer, a silicon nitride layer, and a metal nitride layer.

The first and second mold layers ML1 and ML2 may include different materials from each other. Each of the first and second mold layers ML1 and ML2 may include one or more of an amorphous silicon layer, an amorphous carbon layer, a spin-on-hardmask (SOH) layer, and a spin-on-carbon (SOC) layer.

First photoresist patterns PR1 may be formed on the second mold layer ML2. For example, the formation of the first photoresist patterns PR1 may include forming a first photoresist layer on the second mold layer ML2, and then performing on the first photoresist layer a first photolithography process using the first photomask (i.e., the first group CG1) discussed with reference to FIG. 1. The first photolithography process may include exposure and development processes. For example, an extreme ultraviolet (EUV) light source may be used to perform the exposure process of the first photolithography process. The first photoresist patterns PR1 may be formed by the first to third layout patterns LP1 to LP3 of the layout LAY shown in FIG. 1.

Figure 5A:
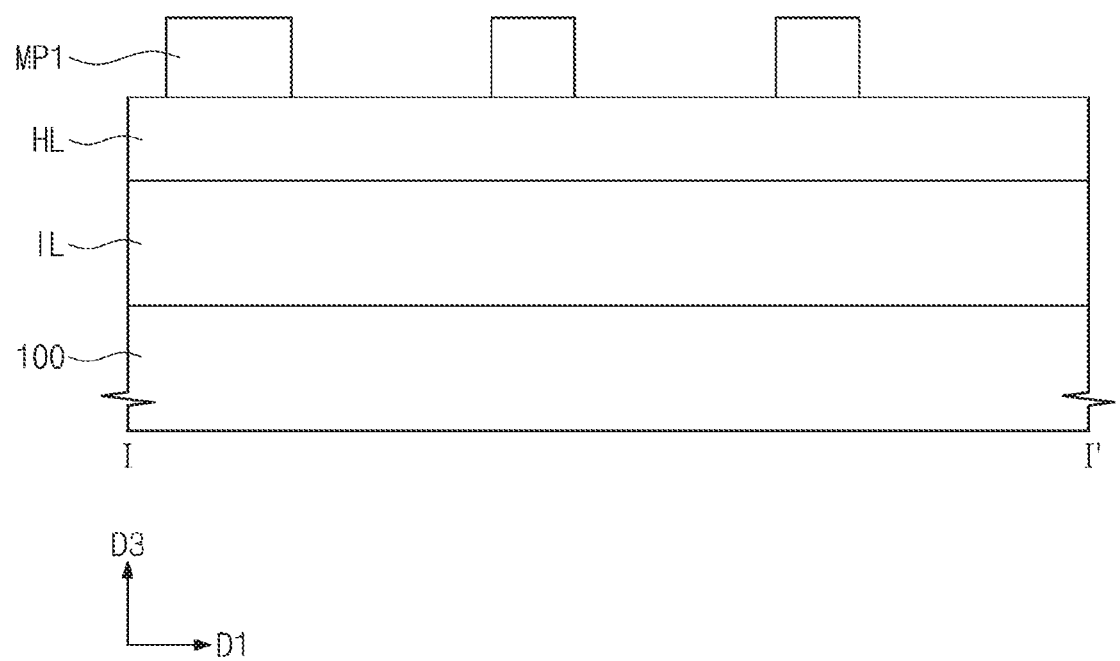
Figure 5B:
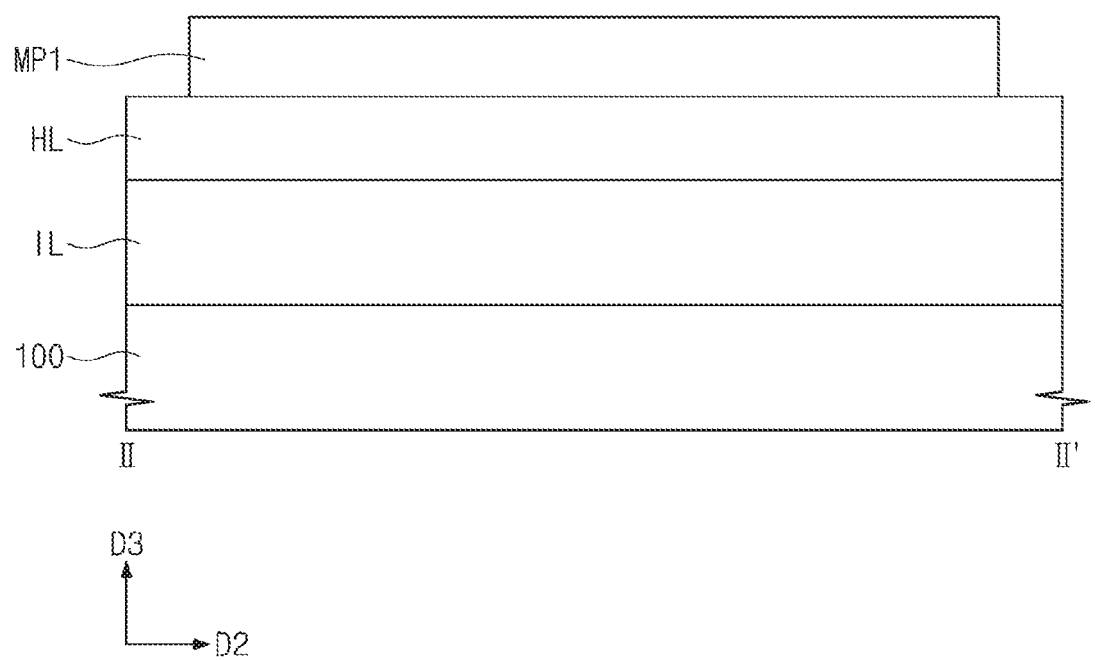

Referring to FIGS. 4, 5A, and 5B, the first photoresist patterns PR1 may be used as an etching mask to sequentially etch the second mold layer ML2 and the first mold layer ML1, and thus first mold patterns MP1 may be formed.

For example, the formation of the first mold patterns MP1 may include using the first photoresist patterns PR1 as an etching mask to pattern the second mold layer ML2, using the patterned second mold layer ML2 as an etching mask to pattern the first mold layer ML1, and then removing remaining first photoresist patterns PR1 and the patterned second mold layer ML2. The first mold patterns MP1 of FIG. 4 may have substantially the same planar shape as that of the first photoresist patterns PR1 of FIG. 2.

Figure 7A:
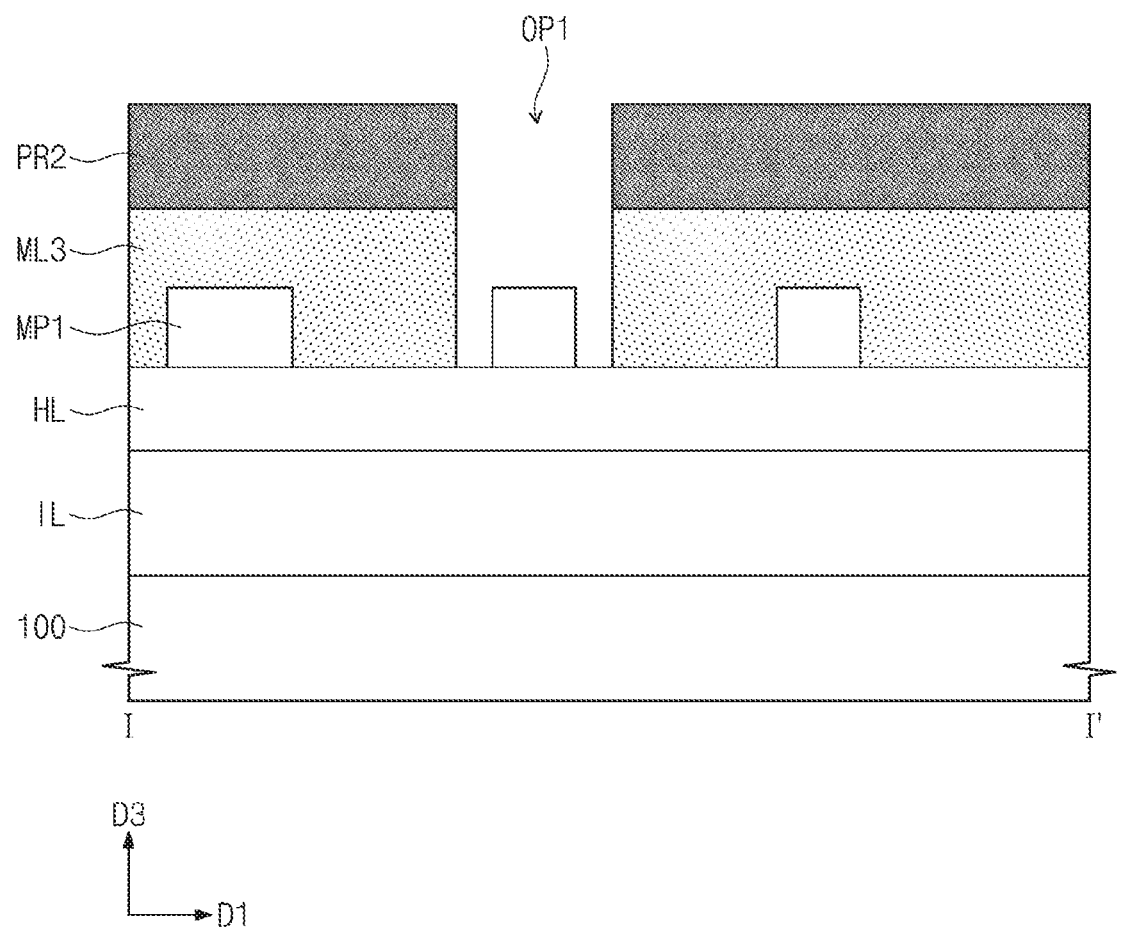
Figure 7B:
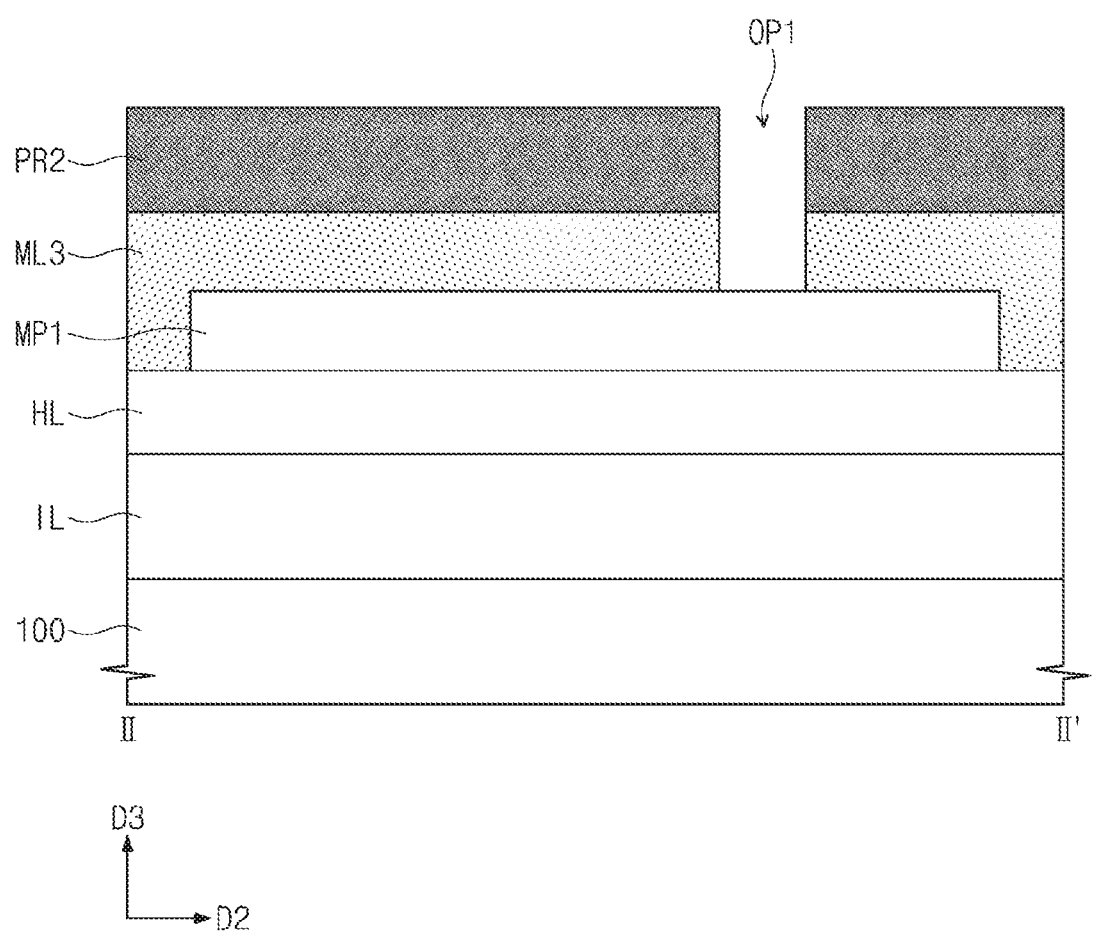

Referring to FIGS. 6, 7A, and 7B, a third mold layer ML3 may be formed to cover the first mold patterns MP1. The third mold layer ML3 may be formed of the same material as that of the second mold layer ML2.

A second photoresist pattern PR2 having first openings OP1 may be formed on the third mold layer ML3. For example, the formation of the second photoresist pattern PR2 may include forming a second photoresist layer on the third mold layer ML3, and then performing on the second photoresist layer a second photolithography process using the third photomask (i.e., the third group CG3) discussed with reference to FIG. 1. For example, an ArF light source may be used to perform an exposure process of the second photolithography process. The cut patterns CUP of the layout LAY shown in FIG. 1 may be used to form the first openings OP1 of the second photoresist pattern PR2.

The second photoresist pattern PR2 may be used as a mask to pattern the third mold layer ML3. The first openings OP1 may partially expose the first mold patterns MP1.

Figure 9A:
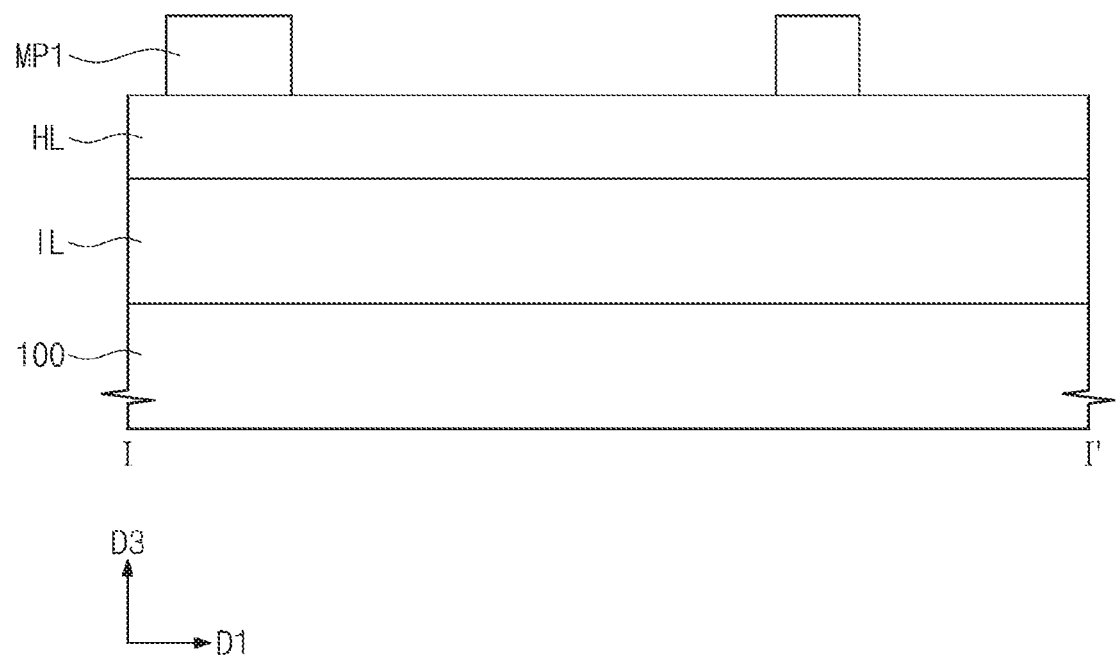
Figure 9B:
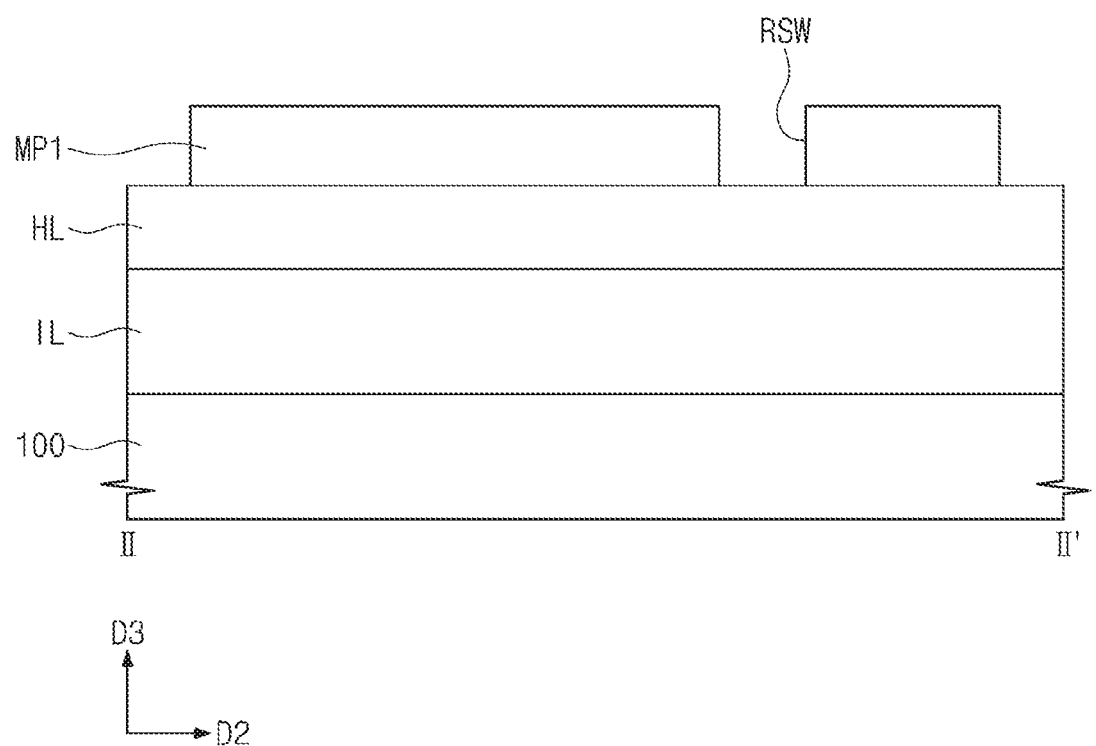

Referring to FIGS. 8, 9A, and 9B, a removal process may be performed to selectively remove portions of the first mold patterns MP1 that are exposed by the first openings OP1. For example, ones of the first mold pattern MP1 may be partially removed and divided into pairs of the divided ones of the first mold patterns MP1.

From a plan view perspective, the pairs of the divided ones of the first mold patterns MP1 may include rounded sidewalls RSW facing each other. The rounded sidewalls RSW may be formed when a central portion of a first mold pattern MP1 is etched more than an edge portion of the first mold pattern MP1 during the etching process on the first mold pattern MP1.

A removal process may be performed to completely remove the patterned third mold layer ML3 and the second photoresist pattern PR2 remaining after the etching process.

Figure 10:
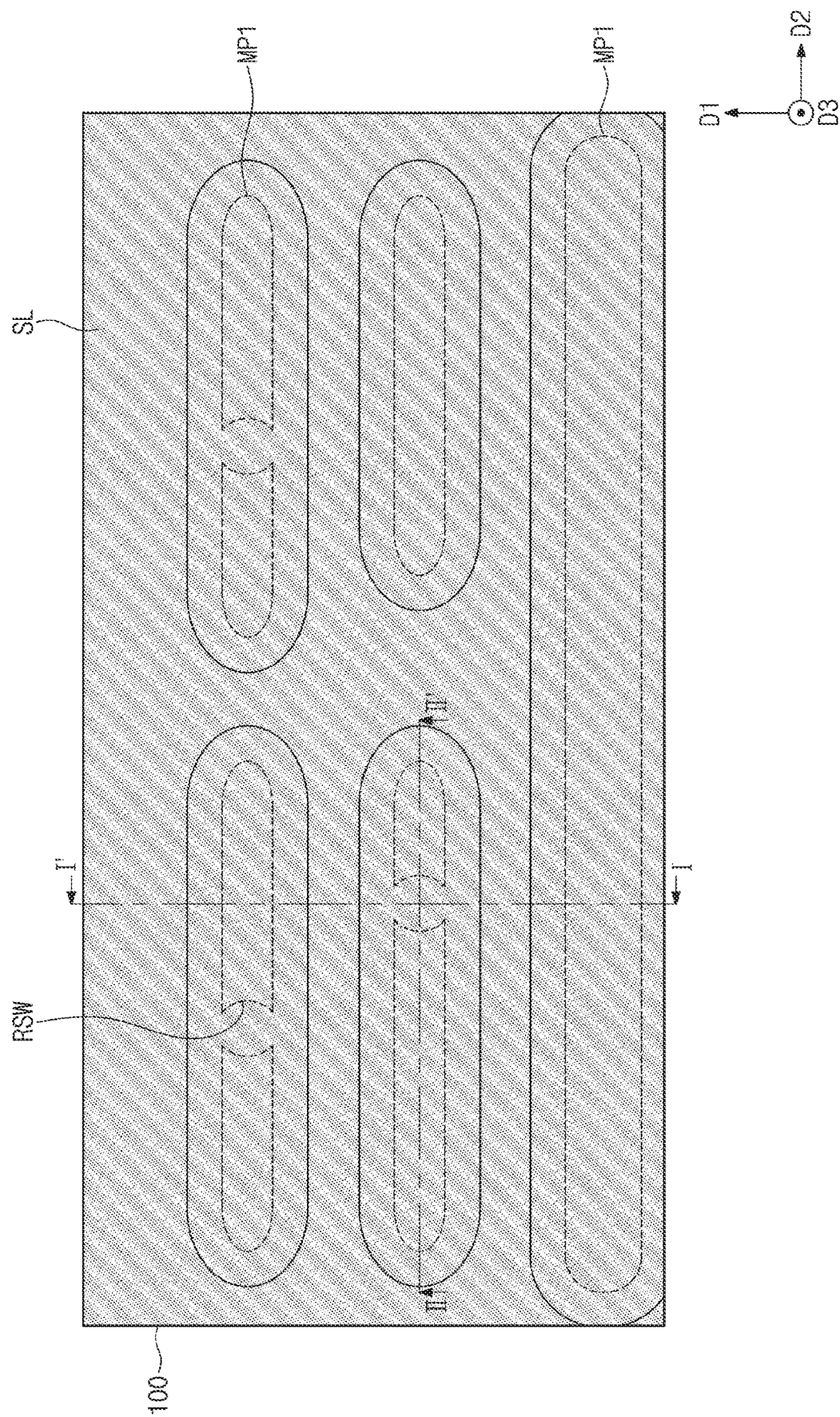
Figure 11A:
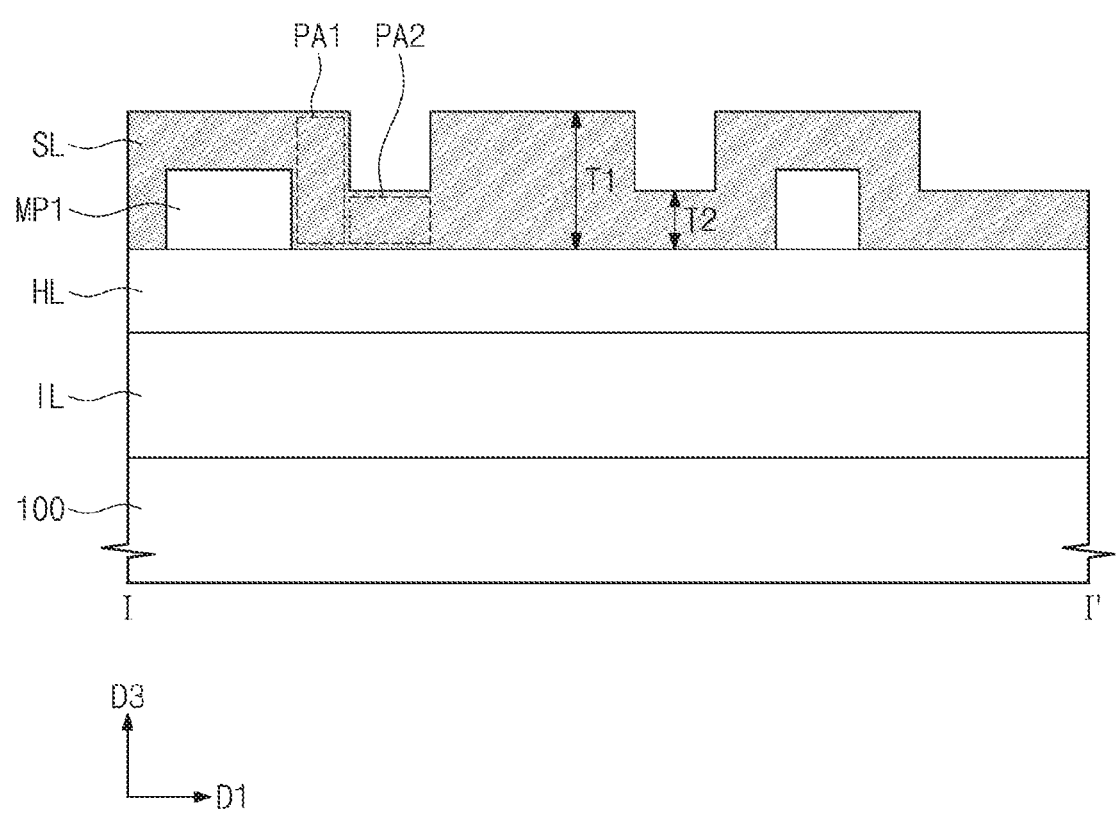
Figure 11B:
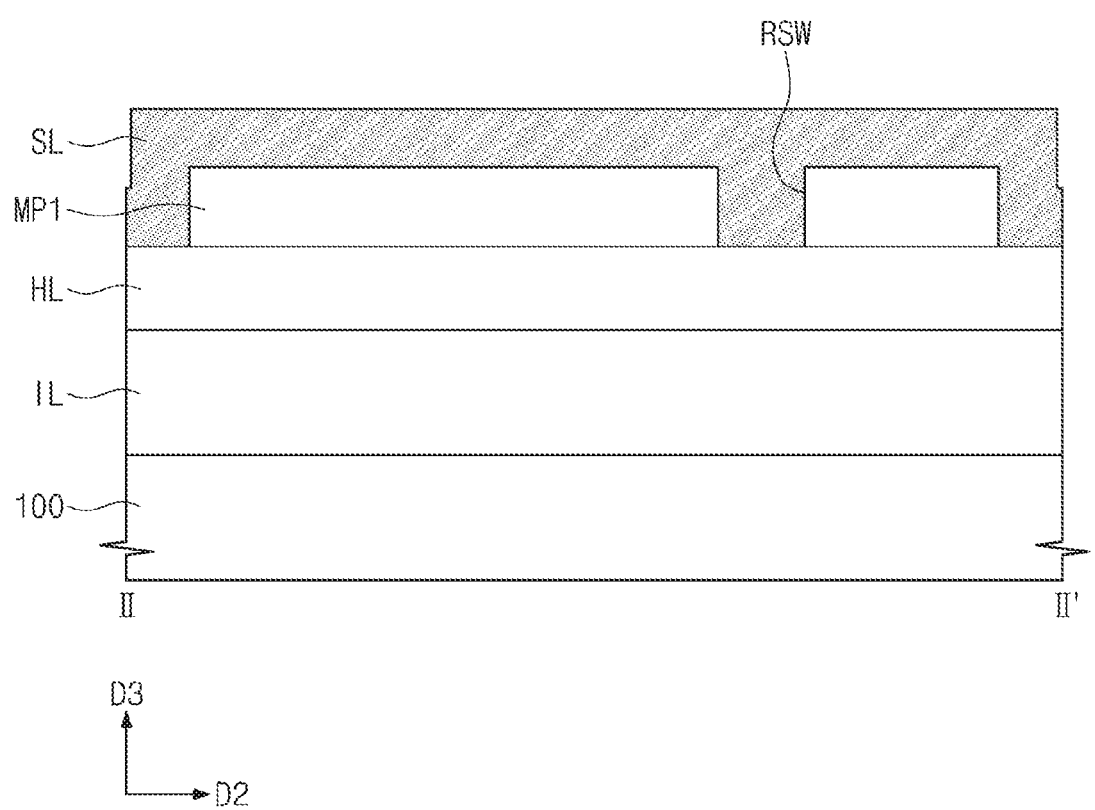

Referring to FIGS. 10, 11A, and 11B, a spacer layer SL may be formed on an entire surface of the substrate 100. The spacer layer SL may be formed to conformally cover an exposed surface of the hardmask layer HL and exposed surfaces of the first mold patterns MP1. The spacer layer SL may fill a space between the rounded sidewalls RSW facing each other. For example, the spacer layer SL may include one or more of TiO, SiCN, SiCON, and SiN.

The spacer layer SL may include a first segment PA1 covering a sidewall of the first mold pattern MP1 and a second segment PA2 extending from the first segment PA1 onto a top surface of the hardmask layer HL. The first segment PA1 may have a first thickness T1 in a vertical direction, and the second segment PA2 may have a second thickness T2 in the vertical direction. The first thickness T1 may be greater than the second thickness T2.

Figure 12:
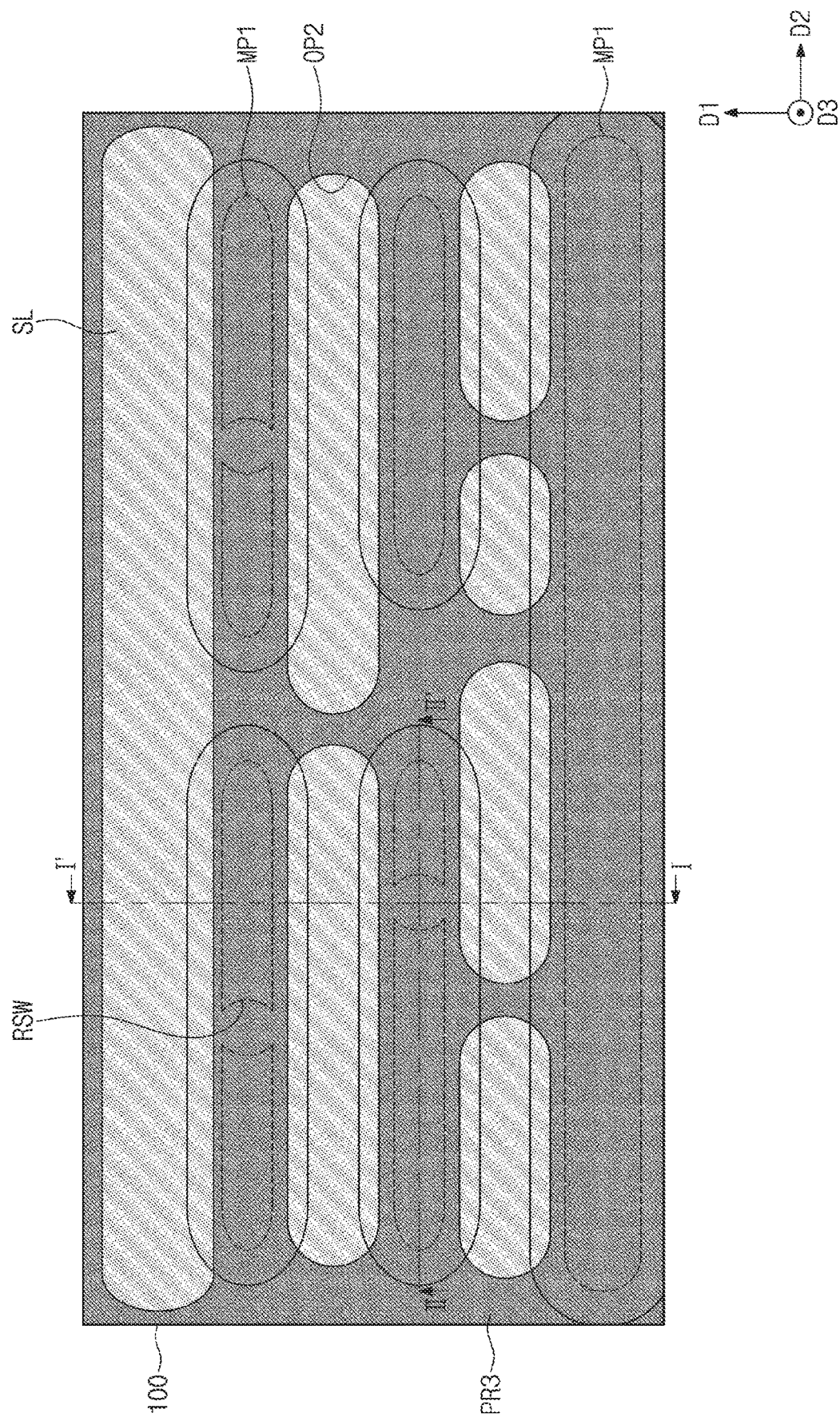
Figure 13A:
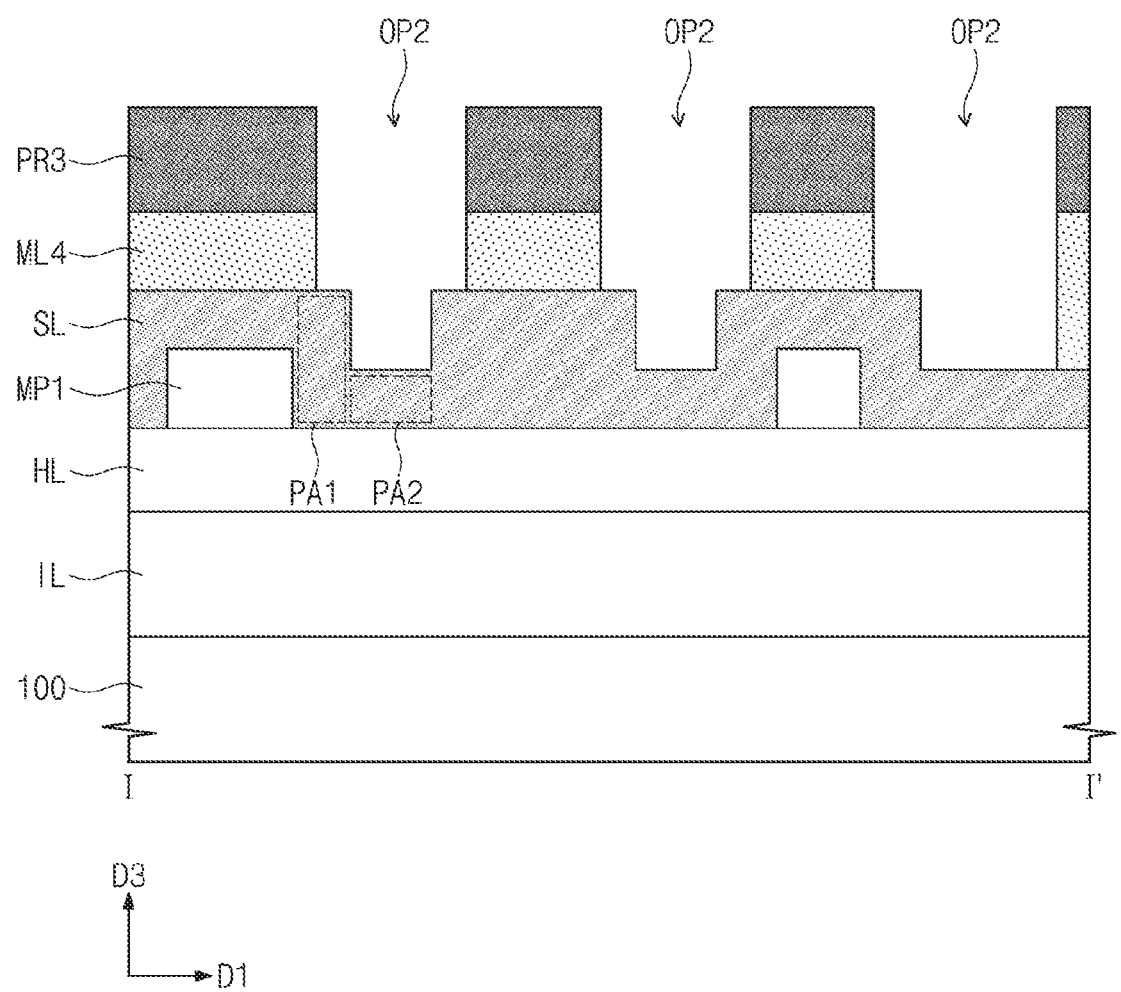
Figure 13B:
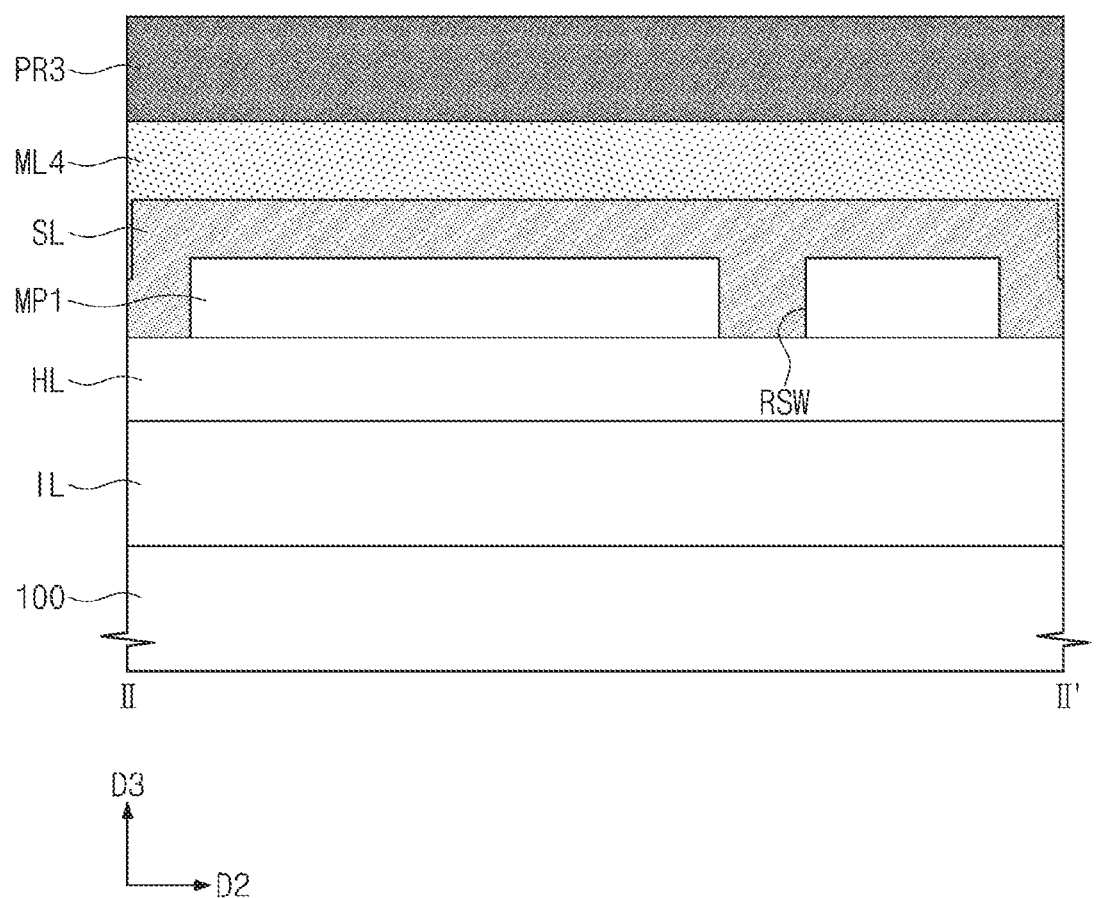

Referring to FIGS. 12, 13A, and 13B, a fourth mold layer ML4 may be formed to cover the spacer layer SL. The fourth mold layer ML4 may be formed of the same material as that of the second mold layer ML2.

A third photoresist pattern PR3 having second openings OP2 may be formed on the fourth mold layer ML4. For example, the formation of the third photoresist pattern PR3 may include forming a third photoresist layer on the fourth mold layer ML4, and then performing on the third photoresist layer a third photolithography process using the second photomask (i.e., the second group CG2) discussed with reference to FIG. 1. For example, an extreme ultraviolet (EUV) light source may be used to perform an exposure process of the third photolithography process. The second openings OP2 of the third photoresist pattern PR3 may be formed corresponding to the fourth to sixth layout patterns LP4 to LP6 of the layout LAY shown in FIG. 1.

The third photoresist pattern PR3 may be used as a mask to pattern the fourth mold layer ML4. The second openings OP2 may partially expose the spacer layer SL.

Figure 14:
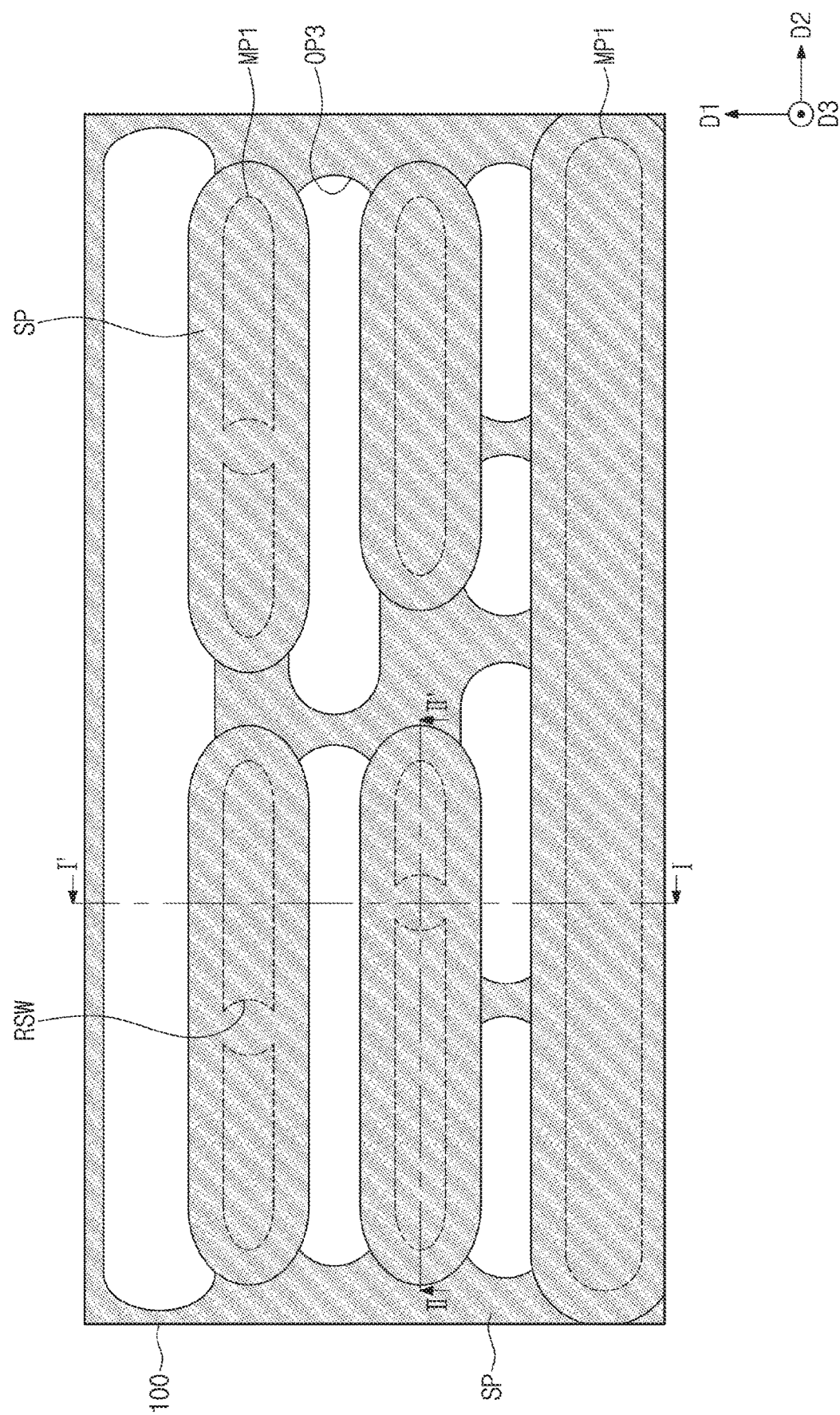
Figure 15A:
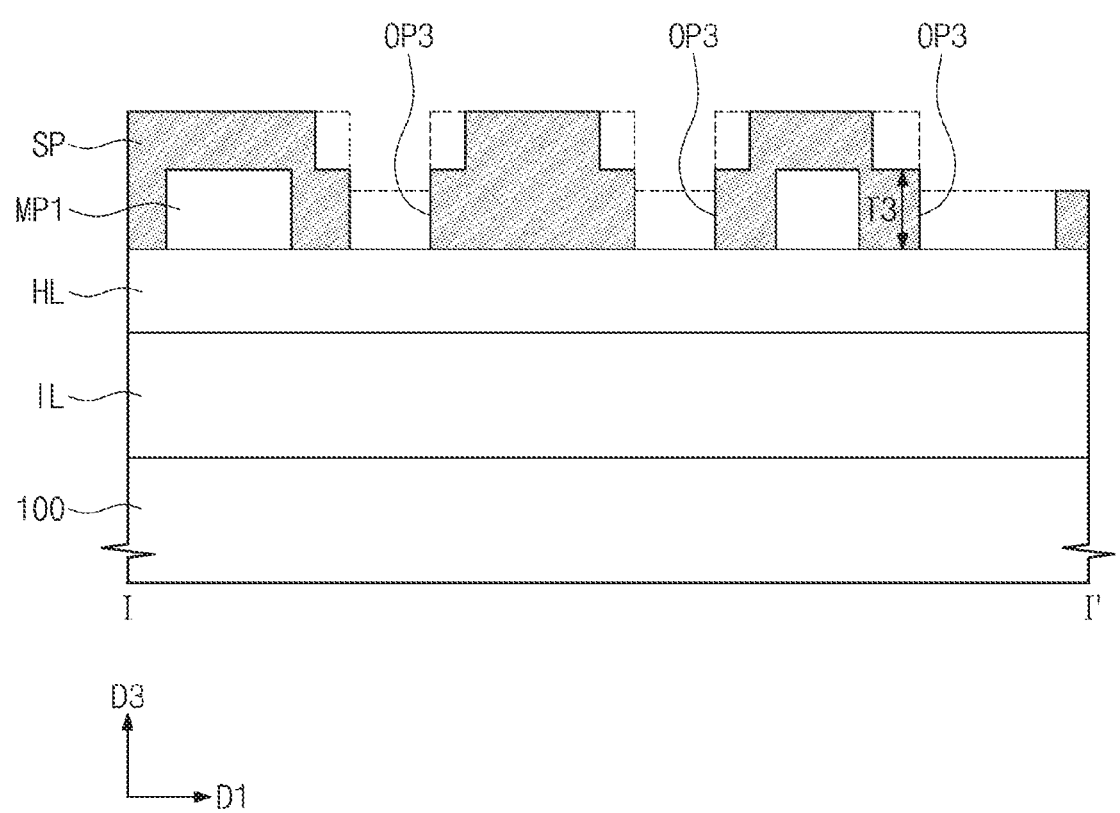
Figure 15B:
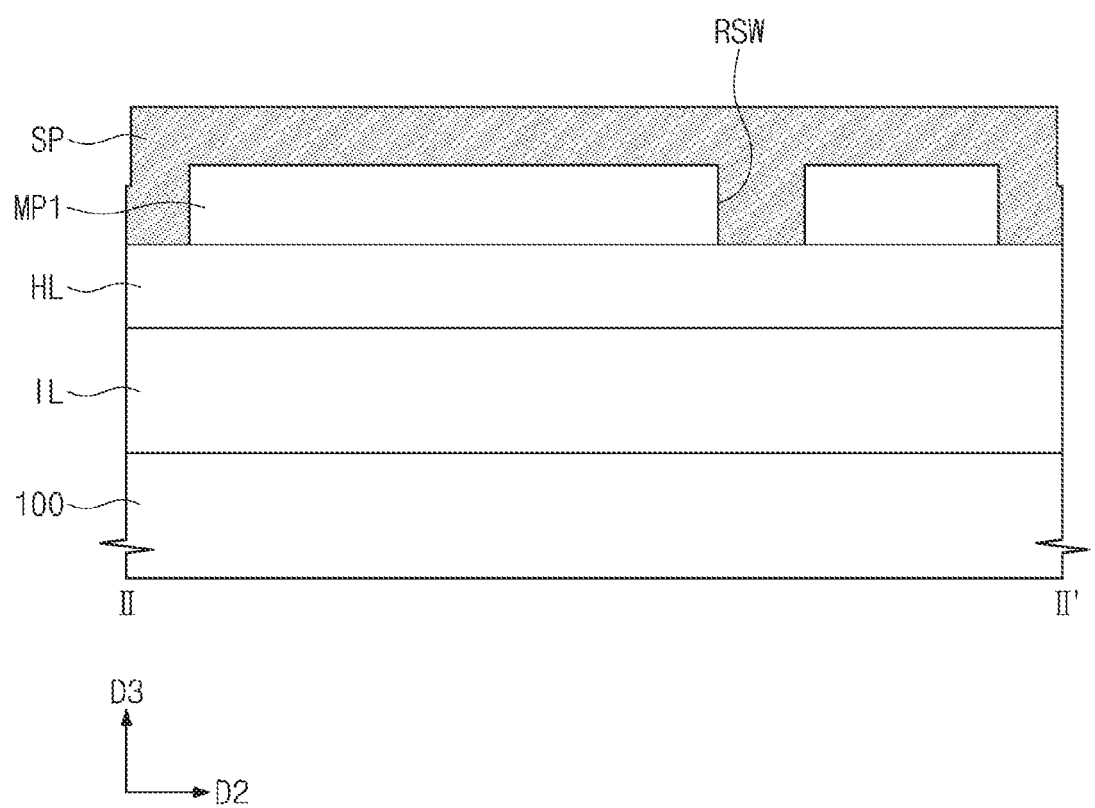

Referring to FIGS. 14, 15A, and 15B, the spacer layer SL exposed by the second openings OP2 may be anisotropically etched to form a spacer pattern SP including third openings OP3.

For example, the spacer layer SL may be anisotropically etched until the second openings OP2 expose the top surface of the hardmask layer HL. The anisotropic etching process may continue until portions of second segment PA2 of the spacer layer SL that are exposed by the second openings OP2 are completely removed.

The portions of the first segment PA1 of the spacer layer SL that are exposed by the second openings OP2 may not be completely removed but may still remain after the anisotropic etching process. The remaining first segment PA1 may have a third thickness T3 in the vertical direction. The third thickness T3 may be equal to or less than a value obtained by subtracting the second thickness T2 from the first thickness T1.

The portions of the first segment PA1 of the spacer layer SL that are exposed by the second openings OP2 may be used as a mask during the anisotropic etching process. The first segment PA1 of the spacer layer SL may thus be used to form the third openings OP3 in a self-alignment manner. Since the third openings OP3 are formed in a self-alignment manner due to the first segment PA1 of the spacer layer SL, each of the third openings OP3 may have a size less than that of each of the second openings OP2 defined in the third photoresist pattern PR3.

Figure 16:
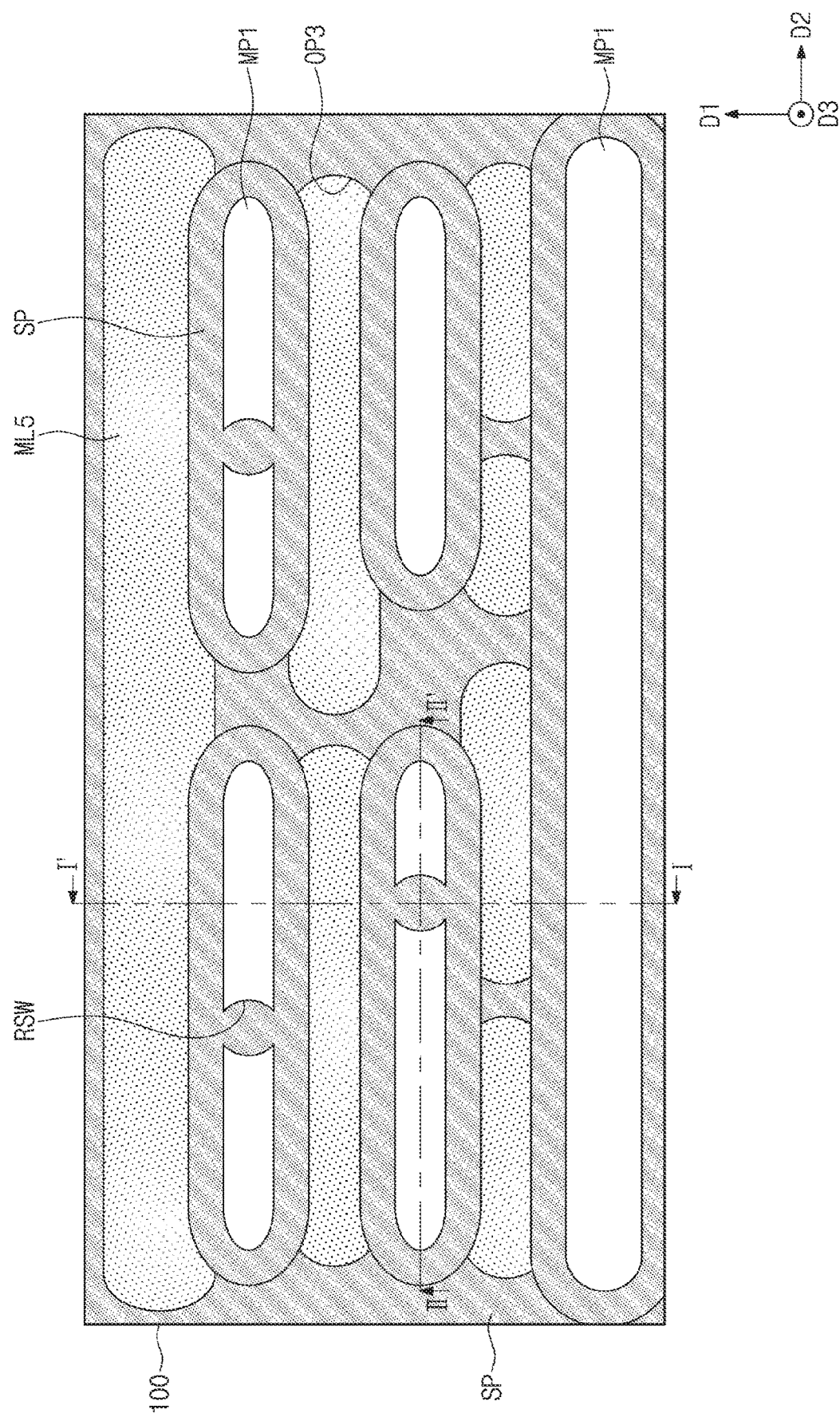
Figure 17A:
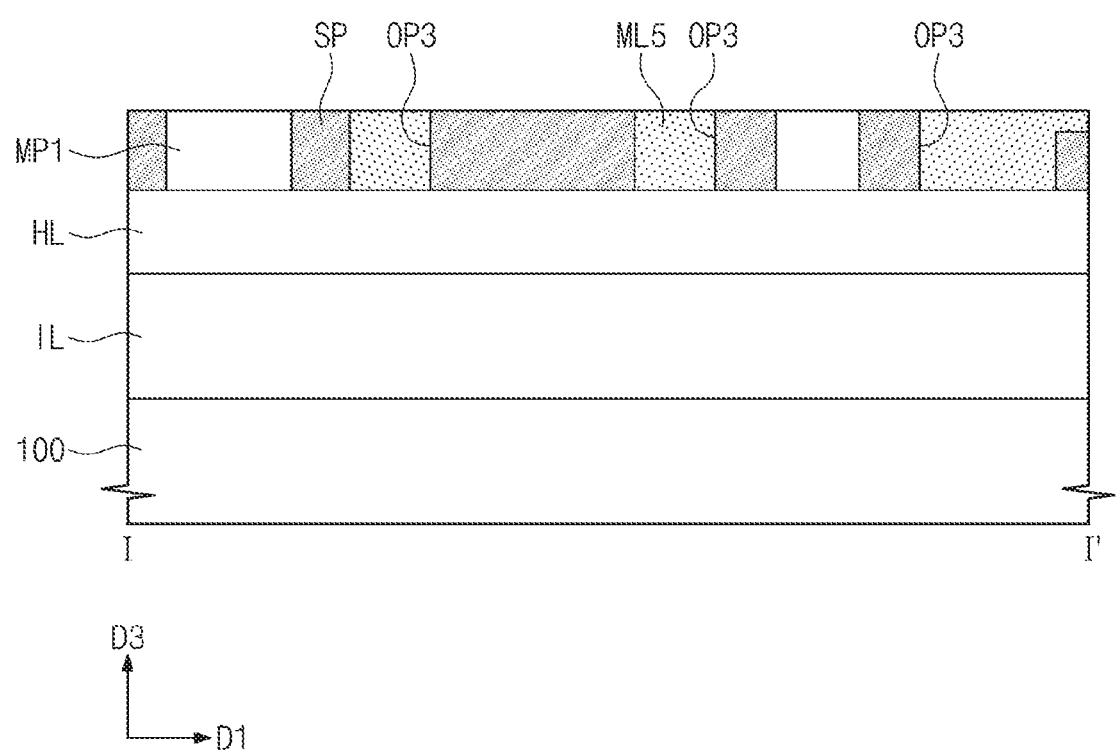
Figure 17B:
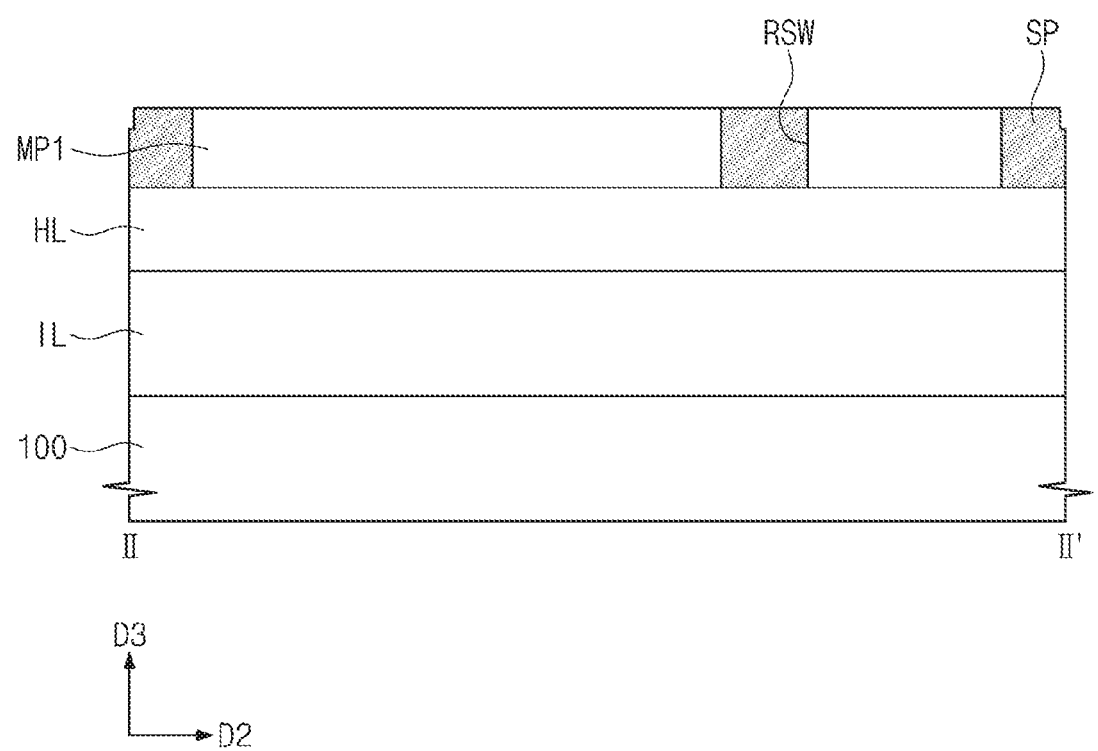

Referring to FIGS. 16, 17A, and 17B, a fifth mold layer ML5 may be formed to cover the spacer pattern SP. The fifth mold layer ML5 may fill the third openings OP3. The fifth mold layer ML5 may include an amorphous silicon layer or a spin-on-hardmask (SOH) layer.

After the fifth mold layer ML5 is formed, a planarization process may be performed until top surfaces of the first mold patterns MP1 are exposed. The planarization process may include a chemical mechanical polishing (CMP) process.

Figure 18:
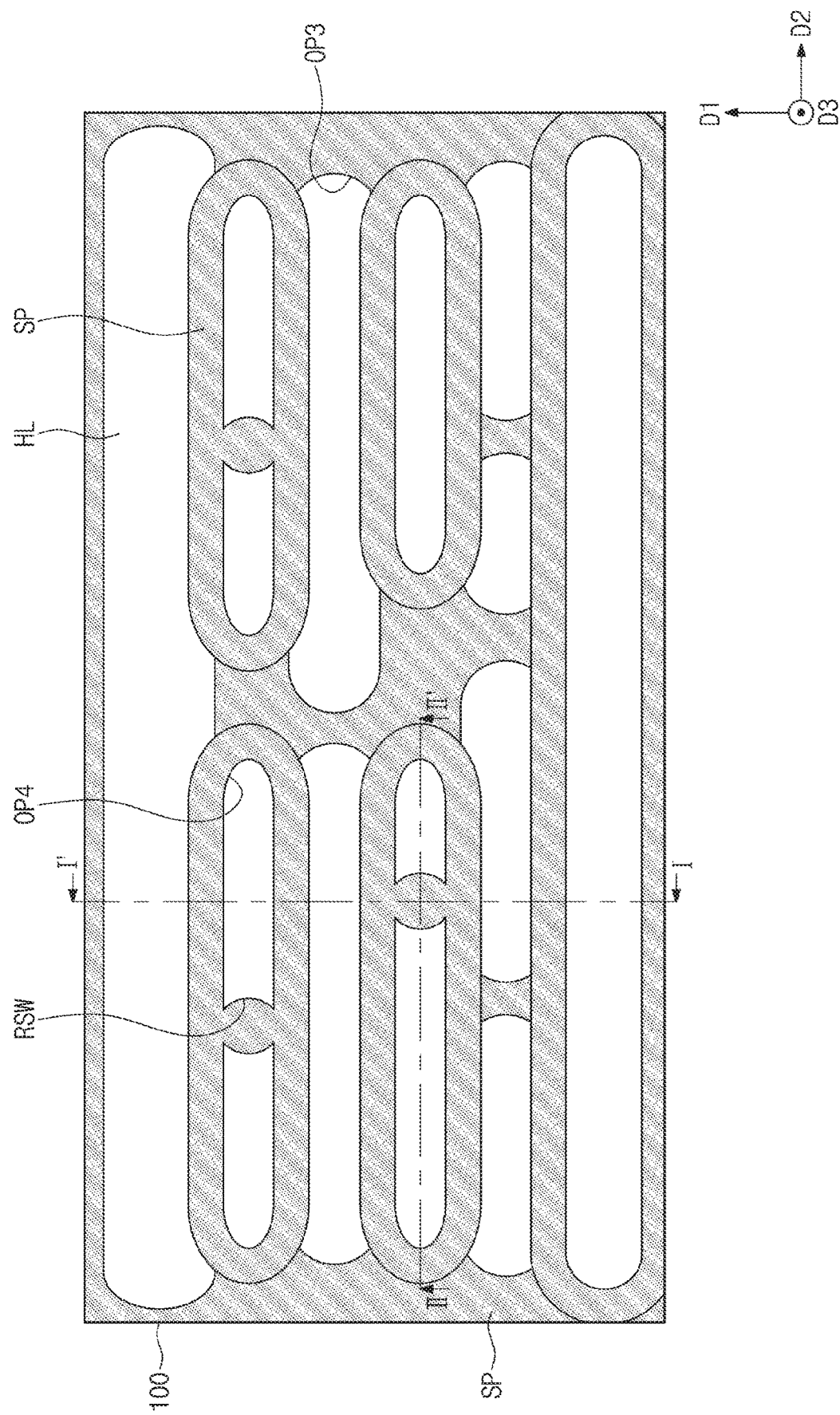
Figure 19A:
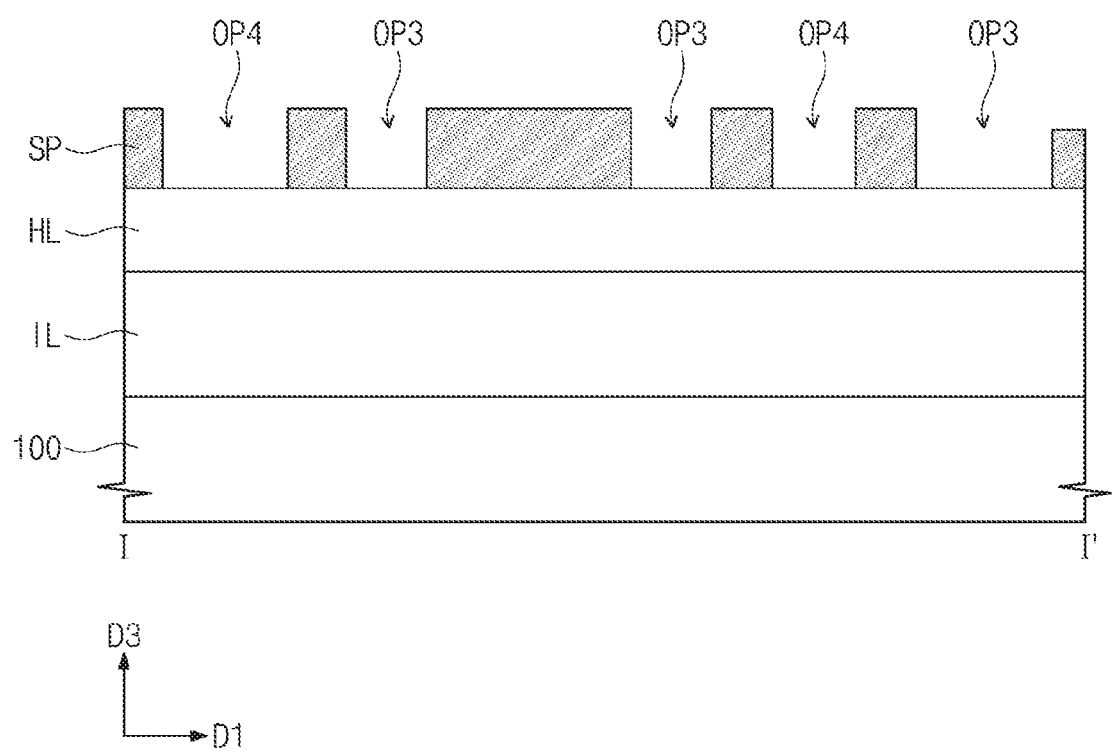
Figure 19B:
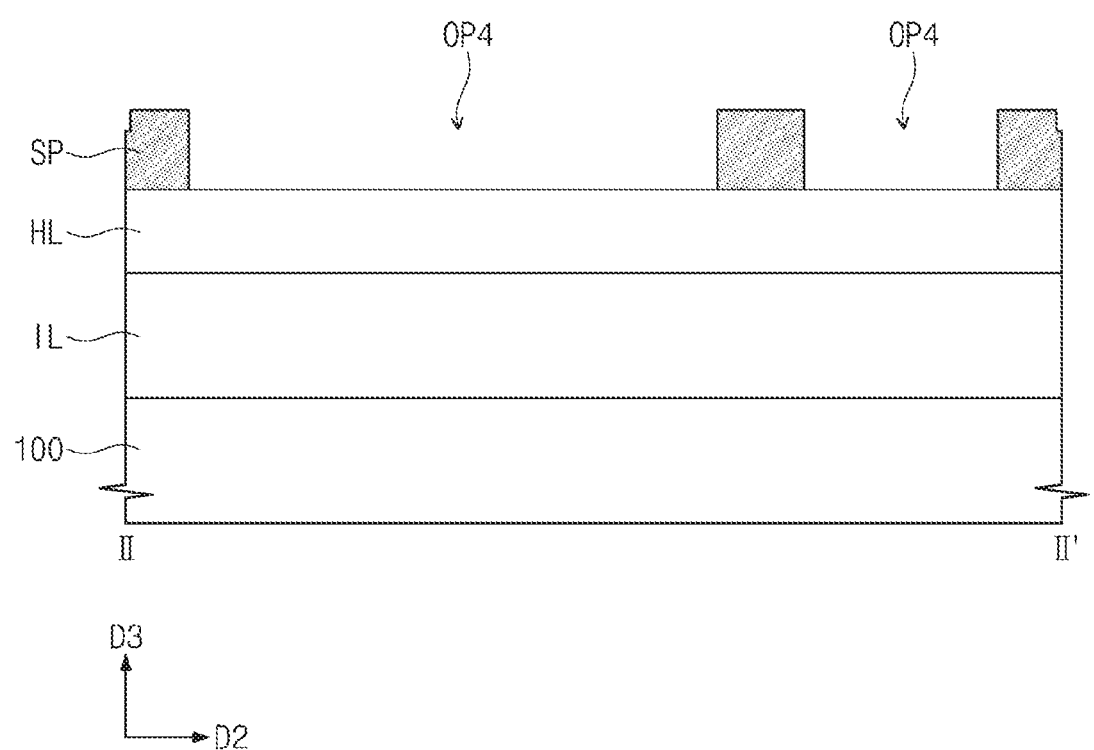

Referring to FIGS. 18, 19A, and 19B, the first mold patterns MP1 and the fifth mold layer ML5 may be removed simultaneously. For example, the first mold patterns MP1 and the fifth mold layer ML5 may be removed at the same time by a wet etching process that uses an etchant including aqueous ammonia. Accordingly, only the spacer pattern SP may remain on the hardmask layer HL.

The removal of the first mold patterns MP1 may lead to the formation of fourth openings OP4. The spacer pattern SP may include the third openings OP3 and the fourth openings OP4. The third and fourth openings OP3 and OP4 may partially expose the top surface of the hardmask layer HL.

Figure 20:
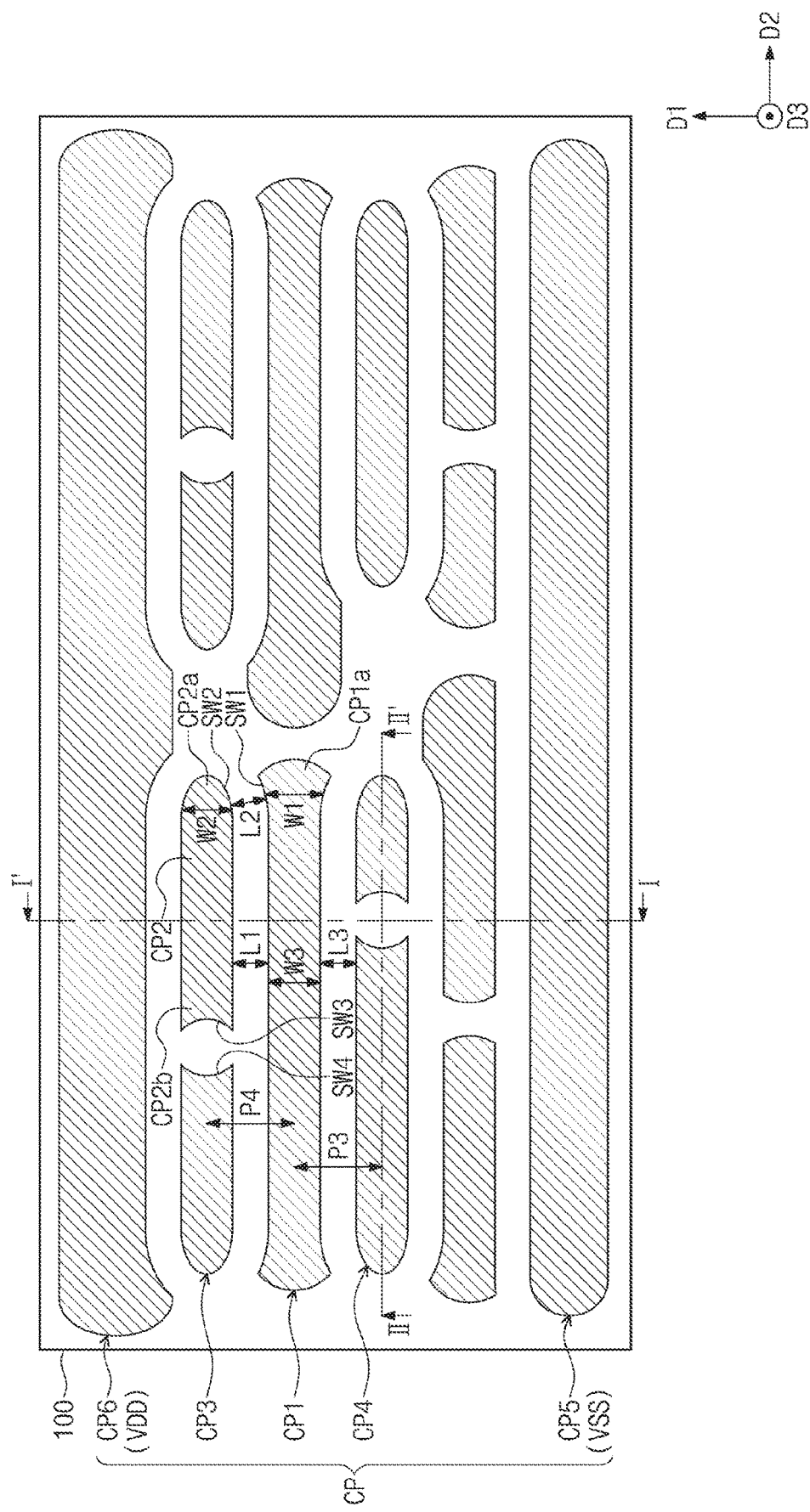
Figure 21A:
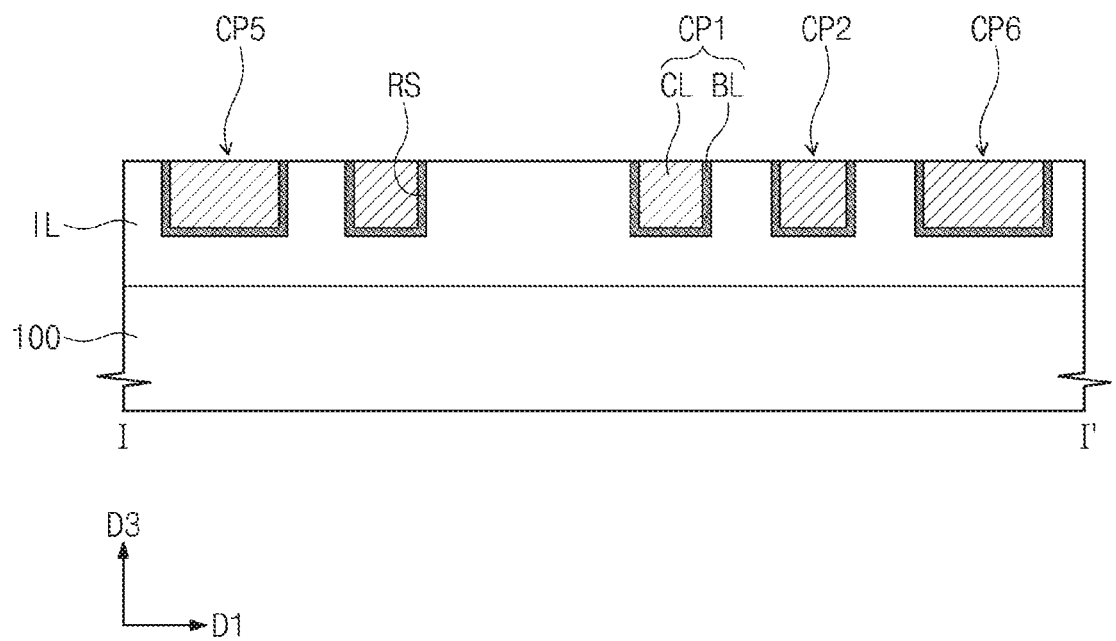
Figure 21B:
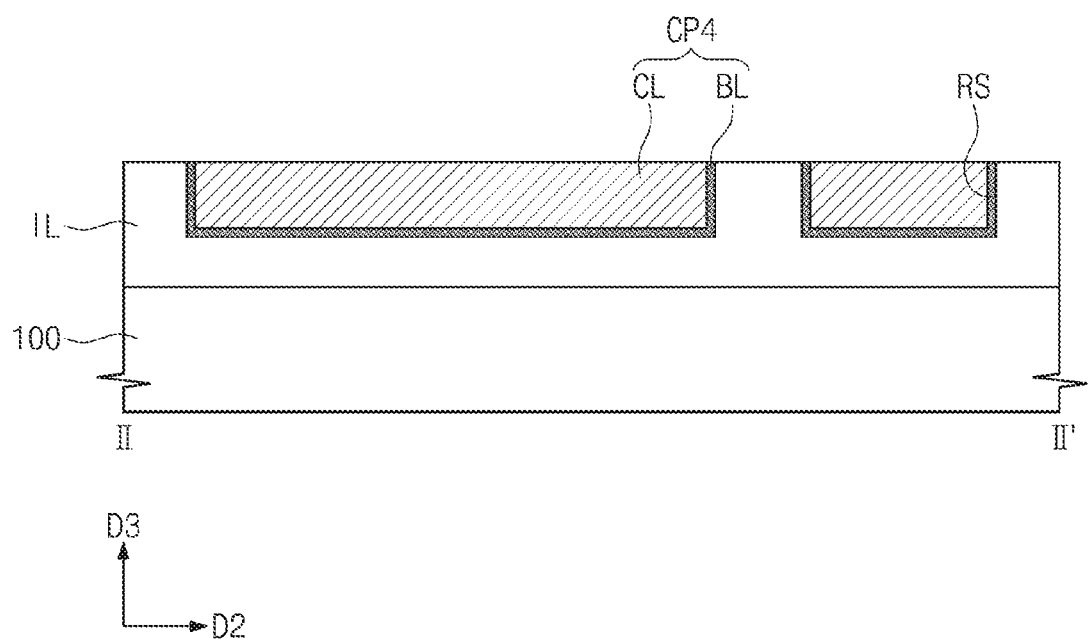

Referring to FIGS. 20, 21A, and 21B, the spacer pattern SP may be used as an etching mask to pattern the hardmask layer HL. The patterned hardmask layer HL may be used as an etching mask to pattern an upper portion of the interlayer dielectric layer IL, which may result in the formation of recesses RS on the upper portion of the interlayer dielectric layer IL. The spacer pattern SP and the patterned hardmask layer HL may be removed.

A conductive pattern CP may be formed to fill each of the recesses RS of the interlayer dielectric layer IL. The formation of the conductive pattern CP may include sequentially forming a barrier layer BL and a conductive layer CL that fill each of the recesses RS. The barrier layer BL may include Ti, TiN, or a combination thereof, and the conductive layer CL may include copper (Cu) or tungsten (W). A damascene process may be used to form the conductive pattern CP.

A semiconductor device according to some embodiments of the inventive concepts may include the interlayer dielectric layer IL on the substrate 100. The conductive patterns CP may be in upper portions of the interlayer dielectric layer IL. For example, the conductive patterns CP may constitute a first metal layer of the semiconductor device.

The conductive patterns CP may extend in parallel to each other in a second direction D2. The conductive patterns CP may be arranged in a first direction D1. The conductive patterns CP may include first to sixth conductive patterns CP1 to CP6.

The first to fourth conductive patterns CP1 to CP4 may be between the fifth and sixth conductive patterns CP5 and CP6 that extend in the second direction D2. The fifth conductive pattern CP5 may be, for example, a ground line to which a ground voltage VSS is applied. The sixth conductive pattern CP6 may be, for example, a power line to which a power voltage VDD is applied.

The first conductive pattern CP1 may be adjacent in the first direction D1 to the fourth conductive pattern CP4. The second conductive pattern CP2 may be adjacent in the first direction D1 to the first conductive pattern CP1. The first and second conductive patterns CP1 and CP2 may be spaced apart from each other at a first distance L1 in the first direction D1. The third conductive pattern CP3 may be adjacent in the first direction D1 to the first conductive pattern CP1. The third and second conductive patterns CP3 and CP2 may be linearly arranged along the second direction D2.

The first conductive pattern CP1 may include a first segment CP1a adjacent to one end thereof. The first segment CP1a of the first conductive pattern CP1 may have a width W1 that increases toward the second direction D2. The first segment CP1a of the first conductive pattern CP1 may include a first sidewall SW1. From a plan view perspective, the first sidewall SW1 may have a rounded shape.

The second conductive pattern CP2 may include a first segment CP2a adjacent to one end thereof. The first segment CP2a of the second conductive pattern CP2 may have a width W2 that decreases toward the second direction D2. The first segment CP2a of the second conductive pattern CP2 may be adjacent to the first segment CP1a of the first conductive pattern CP1.

The first segment CP2a of the second conductive pattern CP2 may include a second sidewall SW2. From a plan view perspective, the second sidewall SW2 may have a rounded shape. The second sidewall SW2 may face the first sidewall SW1. A minimum distance between the first and second sidewalls SW1 and SW2 may be a second distance L2. The second distance L2 may be substantially equal to the first distance L1.

The second conductive pattern CP2 may include a second segment CP2b adjacent to another end thereof. The second segment CP2b may include a third sidewall SW3. From a plan view perspective, the third sidewall SW3 may have a rounded shape. The third sidewall SW3 may have a recessed shape toward a center of the second conductive pattern CP2. The third conductive pattern CP3 may include a fourth sidewall SW4 facing the third sidewall SW3. From a plan view perspective, the fourth sidewall SW4 may have a rounded shape. The fourth sidewall SW4 may have a recessed shape toward a center of the third conductive pattern CP3.

The first to fourth conductive patterns CP1 to CP4 may be arranged at a regular pitch in the first direction D1. For example, a third pitch P3 may be provided between the first and fourth conductive patterns CP1 and CP4 adjacent to each other in the first direction D1. A fourth pitch P4 may be provided between the first and third conductive patterns CP1 and CP3 adjacent to each other in the first direction D1. The third pitch P3 may be substantially equal to the fourth pitch P4.

Each of the first to fourth conductive patterns CP1 to CP4 may include a central segment extending in the second direction D2. For example, the central segments of the first to fourth conductive patterns CP1 to CP4 may have substantially the same width. The first to fourth conductive patterns CP1 to CP4 may be spaced apart from each other at the same distance in the first direction D1. For example, the first and fourth conductive patterns CP1 and CP4 may be spaced apart from each other at a third distance L3 in the first direction D1. The third distance L3 may be substantially equal to the first distance L1.

Figure 22:
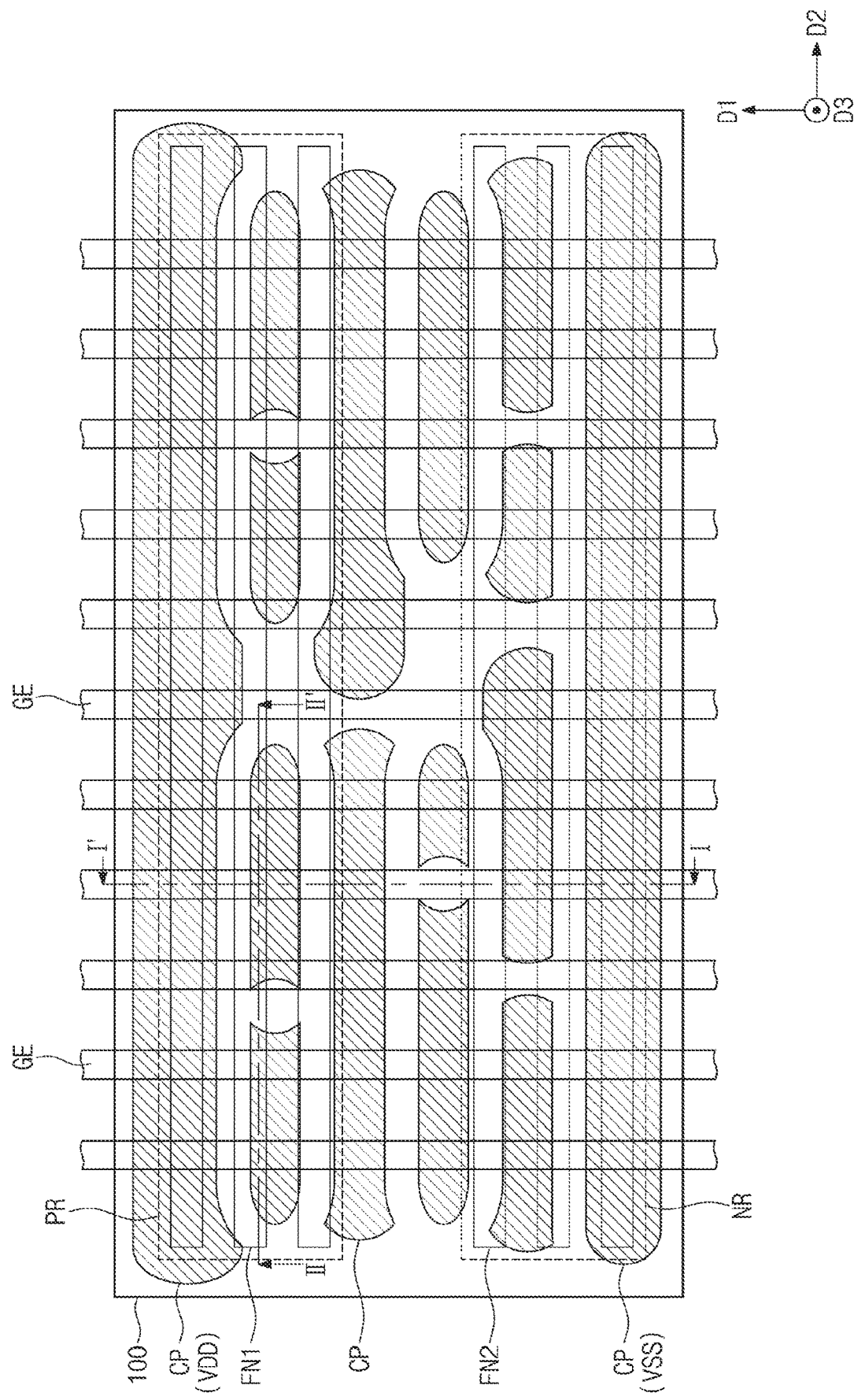
FIG. 22 is a plan view illustrating a semiconductor device according to some embodiments of the inventive concepts.
Figure 23A:
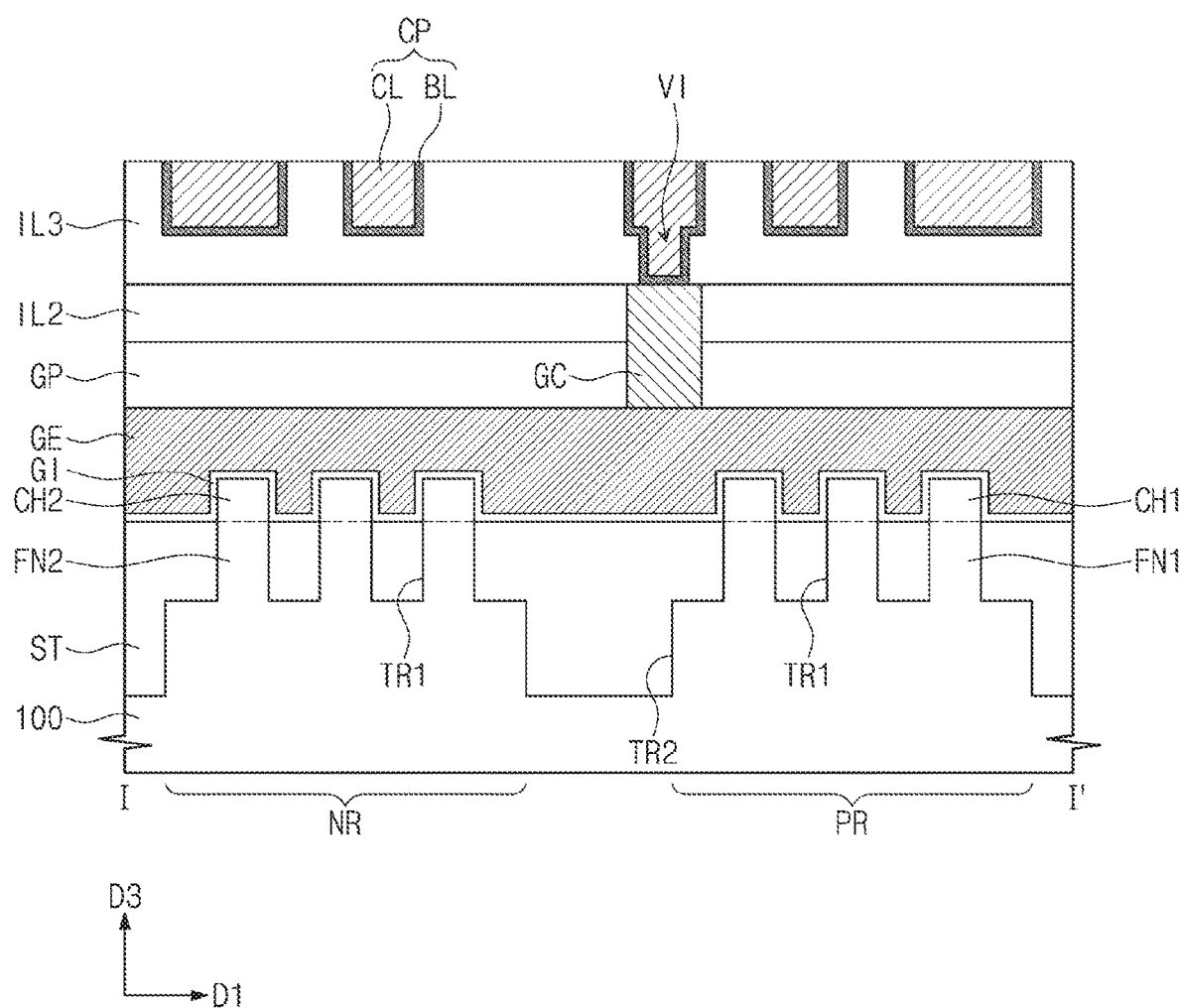
FIGS. 23A and 23B are cross-sectional views respectively taken along lines I-I' and II-II' of FIG. 22.
Figure 23B:
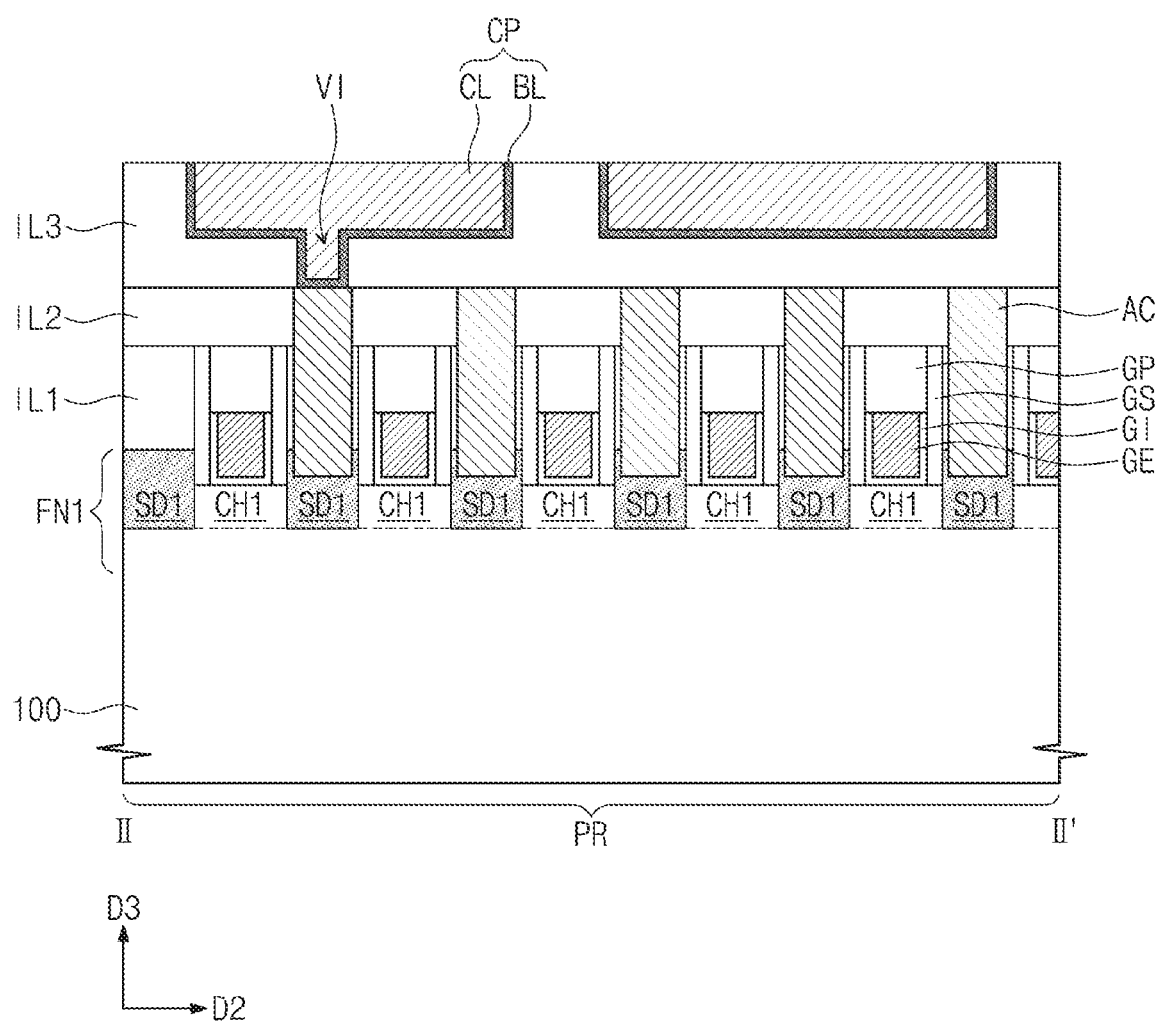

FIG. 22 is a plan view illustrating a semiconductor device according to some embodiments of the inventive concepts. FIGS. 23A and 23B are cross-sectional views respectively taken along lines I-I' and II-II' of FIG. 22. With respect to FIGS. 22, 23A, and 23B, a detailed description of technical features repetitive to those discussed above with reference to FIGS. 20, 21A, and 21B may be omitted for brevity, and differences thereof may be discussed in detail.

Referring to FIGS. 22, 23A, and 23B, a logic cell may be provided on a substrate 100. The substrate 100 may be provided thereon with a device isolation layer ST that defines a first active region PR and a second active region NR. For example, the first active region PR may be a PMOSFET region, and the second active region NR may be an NMOSFET region. The first and second active regions PR and NR may be defined by a second trench TR2 on an upper portion of the substrate 100, and the device isolation layer ST may fill the second trench TR2. For example, the device isolation layer ST may include a silicon oxide layer.

The first and second active regions PR and NR may be spaced apart from each other in the first direction D1 across the device isolation layer ST. The first and second active regions PR and NR may extend in the second direction D2.

The first active region PR may be provided thereon with a plurality of first active patterns FN1 extending in the second direction D2. The second active region NR may be provided thereon with a plurality of second active patterns FN2 extending in the second direction D2. The first and second active patterns FN1 and FN2 may be vertically protruding portions of the substrate 100. The first and second active patterns FN1 and FN2 may be arranged along the first direction D1.

For example, the first active region PR may be provided thereon with three first active patterns FN1 extending in parallel along the second direction D2. For example, the second active region NR may be provided thereon with three second active patterns FN2 extending in parallel along the second direction D2. The numbers and shapes of the first and second active patterns FN1 and FN2 respectively on the first and second active regions PR and NR are exemplary, and not limited to that shown.

A first trench TR1 may be defined between a pair of the active patterns FN1 and FN2 adjacent to each other in the first direction D1. The device isolation layer ST may further fill the first trenches TR1.

The first and second active patterns FN1 and FN2 may have upper portions higher than a top surface of the device isolation layer ST. The upper portions of the first and second active patterns FN1 and FN2 may vertically protrude beyond the device isolation layer ST. The upper portion of each of the first and second active patterns FN1 and FN2 may be shaped like a fin that protrudes from the device isolation layer ST.

The upper portion of each of the first active patterns FN1 may include first channel regions CH1 and first source/drain regions SD1. The first source/drain regions SD1 may be p-type impurity regions. Each of the first channel regions CH1 may be interposed between a pair of the first source/drain regions SD1. The upper portion of each of the second active patterns FN2 may include second channel regions CH2 and second source/drain regions SD2. The second source/drain regions SD2 may be n-type impurity regions.

Each of the second channel regions CH2 may be interposed between a pair of the second source/drain regions SD2.

The first and second source/drain regions SD1 and SD2 may be epitaxial patterns formed by a selective epitaxial growth process. The first and second source/drain regions SD1 and SD2 may have top surfaces higher than those of the first and second channel regions CH1 and CH2.

The first source/drain regions SD1 may include a semiconductor element whose lattice constant is greater than that of a semiconductor element of the substrate 100. As a result, the first source/drain region SD1 may provide the first channel region CH1 with a compressive stress. The second source/drain region SD2 may include the same semiconductor element as that of the substrate 100. For example, the first source/drain regions SD1 may include silicon-germanium, and the second source/drain regions SD2 may include silicon.

Gate electrodes GE may extend in the first direction D1, while running across the first and second active patterns FN1 and FN2. The gate electrodes GE may be spaced apart from each other in the second direction D2.

The gate electrodes GE may vertically overlap the first and second channel regions CH1 and CH2. Each of the gate electrodes GE may be provided on a top surface and opposite sidewalls of each of the first and second channel regions CH1 and CH2 (see FIG. 23A). For example, the gate electrodes GE may include one or more of conductive metal nitride (e.g., titanium nitride or tantalum nitride) and metal (e.g., titanium, tantalum, tungsten, copper, or aluminum).

A pair of the gate spacers GS may be on opposite sidewalls of each of the gate electrodes GE. The gate spacers GS may extend in the first direction D1 along the gate electrodes GE. The gate spacers GS may have top surfaces higher than those of the gate electrodes GE. The top surfaces of the gate spacers GS may be coplanar with that of a gate capping layer GP which will be discussed below. For example, the gate spacers GS may include one or more of SiCN, SiCON, and SiN. For another example, the gate spacers GS may include a multiple layer consisting of two or more of SiCN, SiCON, and SiN.

A gate dielectric layer GI may be interposed between each of the gate electrodes GE and each of the first and second channel regions CH1 and CH2. Each of the gate dielectric layers GI may extend along a bottom surface of a corresponding one of the gate electrodes GE. Each of the gate dielectric layers GI may cover the top surface and the opposite sidewalls of each of the first and second channel regions CH1 and CH2. The gate dielectric layers GI may include a high-k dielectric material whose dielectric constant is greater than that of a silicon oxide layer.

A gate capping layer GP may be provided on each of the gate electrodes GE. The gate capping layers GP may extend in the first direction D1 along the gate electrodes GE. The gate capping layers GP may include a material exhibiting an etch selectivity to first and second interlayer dielectric layers IL1 and IL2 which will be discussed below. For example, the gate capping layers GP may include one or more of SiON, SiCN, SiCON, and SiN.

The substrate 100 may be provided thereon with a first interlayer dielectric layer IL1 a second interlayer dielectric layer IL2, and a third interlayer dielectric layer IL3 that are sequentially stacked. Each of the first to third interlayer dielectric layers IL1 to IL3 may include a silicon oxide layer or a silicon oxynitride layer.

A pair of the gate electrodes GE may be provided therebetween with one or more active contacts AC that penetrate the first and second interlayer dielectric layers IL1 and IL2 and are electrically connected to the first and second source/drain regions SD1 and SD2. At least one gate electrode GE may be provided thereon with at least one gate contact GC that penetrates the second interlayer dielectric layer IL2 and the gate capping layer GP and is electrically connected to the at least one gate electrode GE.

The active contacts AC and the gate contacts GC may include the same conductive material. The active contacts AC and the gate contacts GC may include at least one metal selected from, for example, aluminum, copper, tungsten, molybdenum, and cobalt.

Conductive patterns CP may be provided in the third interlayer dielectric layer IL3. The conductive patterns CP may constitute a first metal layer of the semiconductor device according to some embodiments. A detailed description of the conductive patterns CP may be substantially the same as that of the conductive patterns CP discussed above with reference to FIGS. 20, 21A, and 21B.

At least one of the conductive patterns CP may include a via VI. The conductive pattern CP may be electrically connected through the via VI to the active contact AC. The conductive pattern CP may be electrically connected through the via VI to the gate contact GC.

In some embodiments, one or more additional metal layers may be provided on the first metal layer. A logic cell may be connected to other logic cells through the first metal layer and the additional metal layers, which may result in constituting a designed circuit.

According to some embodiments of the inventive concepts, a method of manufacturing a semiconductor device may use a plurality of photomasks to from conductive patterns that are highly-integrated on a substrate. In addition, a spacer layer may be used as a mask to adjust a distance between the conductive patterns, and thus the conductive patterns may be formed in a self-alignment manner. Accordingly, it may be possible to reduce or prevent a process risk such as an electrical short between the conductive patterns.

Although some embodiments of the inventive concepts have been discussed with reference to the accompanying figures, it will be understood that various changes in form and details may be made therein without departing from the spirit and scope of the inventive concepts. It therefore will be understood that the embodiments described above are illustrative but not limitative in all aspects.

What is claimed is:

1. A method of manufacturing a semiconductor device, the method comprising:
   forming a hardmask layer on a substrate;
   forming a first mold pattern on the hardmask layer using a first photolithography process;
   conformally forming a spacer layer on the first mold pattern and on portions of the hardmask layer exposed by the first mold pattern;
   forming a first mold layer using a second photolithography process, the first mold layer having a first opening that exposes a portion of the spacer layer;
   forming a spacer pattern by performing an anisotropic etching process on the portion of the spacer layer exposed by the first opening until a portion of a top surface of the hardmask layer is exposed; and
   using the spacer pattern as an etching mask to pattern the hardmask layer.

2. The method of claim 1, wherein the spacer layer comprises:
   a first segment covering a sidewall of the first mold pattern; and a second segment horizontally extending from the first segment, wherein the anisotropic etching process removes a portion of the second segment exposed by the first opening.

3. The method of claim 2, wherein the first opening vertically overlaps at least a portion of the first segment, wherein the at least a portion of the first segment is used as an etching mask when the portion of the second segment is removed.

4. The method of claim 2, wherein the spacer pattern comprises a second opening that is formed by the removing of the portion of the second segment, wherein the first segment is used to form the second opening in a self-alignment manner, and wherein the second opening exposes the portion of the top surface of the hardmask layer.

5. The method of claim 1 further comprising, before forming the spacer layer, performing a third photolithography process that removes a portion of the first mold pattern, wherein the spacer layer fills a region where the portion of the first mold pattern is removed.

6. The method of claim 5, wherein the removing of the portion of the first mold pattern divides the first mold pattern into a pair of first mold patterns, and wherein, from a plan view perspective, the pair of first mold patterns comprises rounded sidewalls facing each other.

7. The method of claim 1, further comprising:

forming a second mold layer covering the spacer pattern;

performing a planarization process until a top surface of the first mold pattern is exposed; and simultaneously removing the first mold pattern and the second mold layer.

8. The method of claim 1, further comprising:

using the patterned hardmask layer as an etching mask to pattern an interlayer dielectric layer that is between the substrate and the hardmask layer; and sequentially forming on the patterned interlayer dielectric layer a barrier layer and a conductive layer to form conductive patterns in the interlayer dielectric layer.

9. The method of claim 1, wherein the forming of the first mold pattern comprises:

forming a second mold layer on the hardmask layer;

performing the first photolithography process to form a first photoresist pattern on the second mold layer; and using the first photoresist pattern as an etching mask to pattern the second mold layer.

10. The method of claim 1, wherein the forming of the first mold layer having the first opening comprises:

forming the first mold layer on the spacer layer;

performing the second photolithography process to form a second photoresist pattern on the first mold layer; and forming the first opening by using the second photoresist pattern as an etching mask to pattern the first mold layer.

11. A method of manufacturing a semiconductor device, the method comprising:

forming a first mold pattern on a hardmask layer on a substrate;

forming a spacer layer on the first mold pattern and on the hardmask layer, the spacer layer comprising a first segment covering a sidewall of the first mold pattern and a second segment horizontally extending from the first segment, the second segment covering a top surface of the hardmask layer;

forming a first mold layer that exposes a portion of the spacer layer;

forming a first opening in the spacer layer by removing the second segment of the exposed portion of the spacer layer via an anisotropic etching process that uses the first segment of the exposed portion as an etching mask; and forming a second opening in the spacer layer by removing the first mold pattern.

12. The method of claim 11, wherein forming the first mold pattern comprises performing a first photolithography process using a first photomask fabricated based on a first layout pattern, and wherein exposing the portion of the spacer layer comprises performing a second photolithography process using a second photomask fabricated based on a second layout pattern.

13. The method of claim 11, further comprising:

using the spacer layer as an etching mask to pattern the hardmask layer, the spacer layer having the first and second openings; and using the patterned hardmask layer as an etching mask to pattern an interlayer dielectric layer on the substrate.

14. The method of claim 13, further comprising sequentially forming on the patterned interlayer dielectric layer a barrier layer and a conductive layer to form conductive patterns in the interlayer dielectric layer.

15. The method of claim 11, wherein removing the first mold pattern comprises:

forming a second mold layer covering the spacer layer and filling the first opening;

performing a planarization process until a top surface of the first mold pattern is exposed; and simultaneously removing the first mold pattern and the second mold layer which are exposed.

* * * * *